(12) United States Patent
Nakano et al.

(10) Patent No.: US 11,174,427 B2
(45) Date of Patent: Nov. 16, 2021

(54) AROMATIC COMPOUND AND ORGANIC ELECTROLUMINESCENCE DEVICE INCLUDING THE SAME

(71) Applicant: Samsung Display Co., Ltd., Yongin-si (KR)

(72) Inventors: Hiromi Nakano, Yokohama (JP); Nobutaka Akashi, Yokohama (JP)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 891 days.

(21) Appl. No.: 15/827,078

(22) Filed: Nov. 30, 2017

(65) Prior Publication Data

US 2018/0155617 A1 Jun. 7, 2018

(30) Foreign Application Priority Data

Dec. 1, 2016 (KR) .................... 10-2016-0162998

(51) Int. Cl.
*C09K 11/06* (2006.01)
*C09K 11/08* (2006.01)
(Continued)

(52) U.S. Cl.
CPC .......... *C09K 11/06* (2013.01); *C09K 11/0844* (2013.01); *C09K 11/0855* (2013.01);
(Continued)

(58) Field of Classification Search
CPC ............. H01L 51/0072; H01L 51/0067; H01L 51/0061; H01L 51/006; H01L 51/5016;
(Continued)

(56) References Cited

U.S. PATENT DOCUMENTS

2015/0144937 A1* 5/2015 Park ................. H05B 33/10
257/40
2016/0053168 A1* 2/2016 Kamada ............ C07D 321/00
250/459.1
(Continued)

FOREIGN PATENT DOCUMENTS

JP 2016-130231 A 7/2016
KR 10-2013-0142967 A 12/2013
(Continued)

OTHER PUBLICATIONS

Machine translation KR-10-2013-0142967, 68 pages. (Year: 2013).*

*Primary Examiner* — Matthew E. Hoban
*Assistant Examiner* — Lynne Edmondson
(74) *Attorney, Agent, or Firm* — Kile Park Reed & Houtteman PLLC

(57) ABSTRACT

Provided are an aromatic compound enhancing emission efficiency of blue light emitting region and an organic electroluminescence device including the same. The aromatic compound according to an embodiment of the inven-
(Continued)

tive concept is represented by Formula 1, and more details about the constituents are provided in the disclosure.

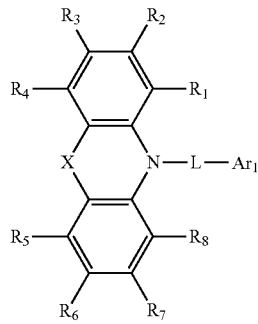

[Formula 1]

9 Claims, 1 Drawing Sheet

(51) Int. Cl.
    *H01L 51/50*     (2006.01)
    *H01L 51/00*     (2006.01)

(52) U.S. Cl.
    CPC ...... *H01L 51/0052* (2013.01); *H01L 51/0059* (2013.01); *H01L 51/0061* (2013.01); *H01L 51/0067* (2013.01); *H01L 51/0072* (2013.01); *H01L 51/0094* (2013.01); *H01L 51/5016* (2013.01); *H01L 51/5056* (2013.01); *C09K 2211/1011* (2013.01); *C09K 2211/1029* (2013.01); *C09K 2211/1033* (2013.01); *C09K 2211/1037* (2013.01); *H01L 51/5012* (2013.01); *H01L 2251/5307* (2013.01)

(58) Field of Classification Search
    CPC ............. H01L 51/5056; H01L 51/0052; H01L 51/0058; H01L 51/5072; H01L 51/5096; H01L 51/0071; H01L 51/5004; H01L 51/506; H01L 51/5092; H01L 51/5064; H01L 51/5088; H01L 51/5206; H01L 51/5221; H01L 51/0035; H01L 51/5008; H01L 51/5012; H01L 51/5024; H01L 51/5076; H01L 51/5203; H01L 2251/301; H01L 2251/308; H01L 2251/5307; C09K 11/06; C09K 11/025; C09K 11/0844; C09K 11/0855; C09K 2211/1029; C09K 2211/1014; C09K 2211/1011; C09K 2211/1033; C09K 2211/1044; C09K 2211/1059; C09K 2211/1088; C09K 2211/1092; C09K 2211/1037; C09K 2211/188; C09B 1/00; C09B 57/008; H05B 33/14

See application file for complete search history.

(56) References Cited

U.S. PATENT DOCUMENTS

| | | |
|---|---|---|
| 2016/0093812 A1 | 3/2016 | Stoessel et al. |
| 2016/0093813 A1 | 3/2016 | Stoessel et al. |

FOREIGN PATENT DOCUMENTS

| | | |
|---|---|---|
| KR | 10-2015-0143552 A | 12/2015 |
| KR | 10-2015-0143553 A | 12/2015 |
| KR | 10-1769764 B1 | 8/2017 |
| WO | 2013172255 A1 | 11/2013 |
| WO | 2014058124 A1 | 4/2014 |

\* cited by examiner

AROMATIC COMPOUND AND ORGANIC ELECTROLUMINESCENCE DEVICE INCLUDING THE SAME

CROSS-REFERENCE TO RELATED APPLICATIONS

This U.S. non-provisional patent application claims priority, under 35 U.S.C. § 119, from Korean Patent Application No. 10-2016-0162998 filed on Dec. 1, 2016, the entire content of which is hereby incorporated by reference.

BACKGROUND

The present disclosure herein relates to an aromatic compound and an organic electroluminescence device including the same.

Active development of organic electroluminescence displays as an image display is on-going. An organic electroluminescence display is different from a liquid crystal display, and is called a self-luminescent display because it recombines holes and electrons injected from a first electrode and a second electrode in an emission layer and emits light from a luminescent material that includes an organic compound in the emission layer.

As an organic electroluminescence device, for example, an organic electroluminescence device composed of a first electrode, a hole transport layer disposed on the first electrode, an emission layer disposed on the hole transport layer, an electron transport layer disposed on the emission layer, and a second electrode disposed on the electron transport layer is known. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light using light emitted by radiation non-activation of the excitons. In addition, the configuration of an organic electroluminescence device is not limited to those described above, and various modifications may be possible.

In an application of an organic electroluminescence device to a display, the decrease of a driving voltage, increase of emission efficiency and extension of life for the organic electroluminescence device are required, and the development of materials which may stably implement these requirements in an organic electroluminescence is also continuously required.

Meanwhile, the development on phosphorescence using triplet state energy or delayed fluorescence using triplet-triplet annihilation (TTA) in which singlet excitons are generated by the collision of triplet excitons is being conducted for achieving a high efficiency organic electroluminescence device.

In particular, thermally activated delayed fluorescence (TADF) materials are being developed as a technology for achieving about 100% internal quantum yield.

Whereas a plurality of high efficiency TADF materials emitting red or green light is currently presented, reports on high efficiency TADF materials emitting blue light with a light emitting wavelength of about 480 nm or lower are limited.

SUMMARY

The present disclosure provides an aromatic compound used in a high efficiency organic electroluminescence device.

The present disclosure also provides a high efficiency organic electroluminescence device including an aromatic compound in an emission layer.

An embodiment of the inventive concept provides an aromatic compound represented by the following Formula 1.

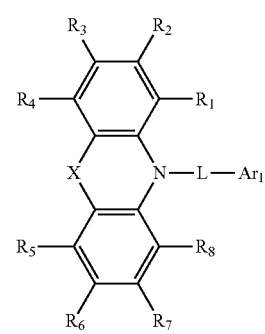

[Formula 1]

In Formula 1, $Ar_1$ is a substituted or unsubstituted heteroaryl group having 4 to 30 carbon atoms for forming a ring, L is a direct linkage, or a substituted or unsubstituted phenylene group, X is a direct linkage, O, S, $NR_a$, $CR_bR_c$, $SiR_dR_e$, $GeR_fR_g$, $P(=O)R_h$, or $P(=S)R_i$.

In Formula 1, $R_1$ to $R_8$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

$R_a$ to $R_i$ are each independently a hydrogen atom, a deuterium atom, a halogen atom, a substituted or unsubstituted silyl group, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, and $R_d$ and $R_e$ are not phenyl group concurrently.

In an embodiment, the aromatic compound represented by Formula 1 may have an absolute value of the difference between the singlet energy level and the triplet energy level of about 0.2 eV or less.

In an embodiment, Formula 1 may be represented by one of the following Formulae 1-1 to 1-10.

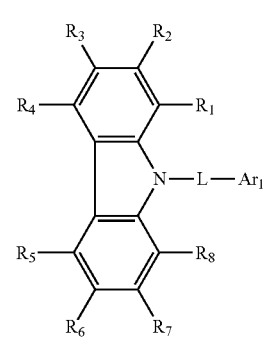

[Formula 1-1]

[Formula 1-2]

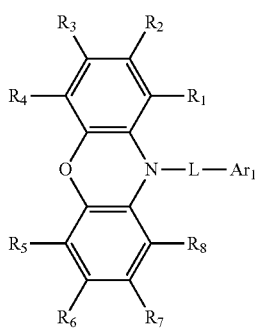

[Formula 1-3]

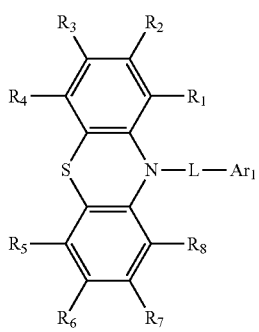

[Formula 1-4]

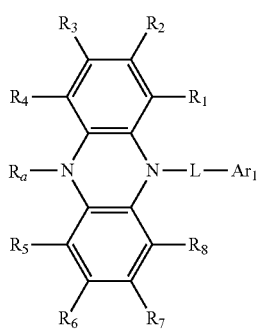

[Formula 1-5]

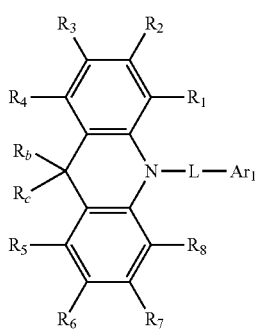

[Formula 1-6]

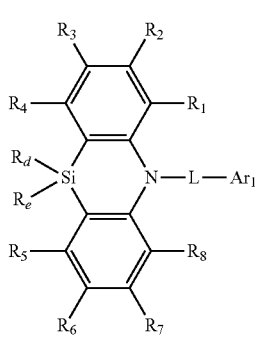

[Formula 1-7]

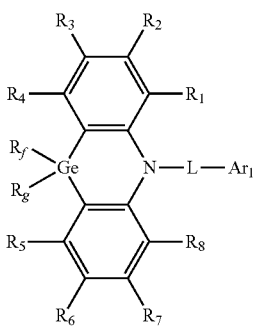

[Formula 1-8]

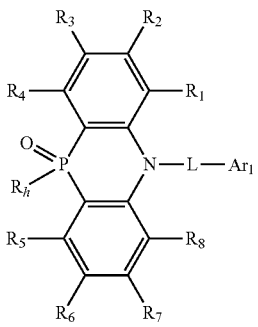

[Formula 1-9]

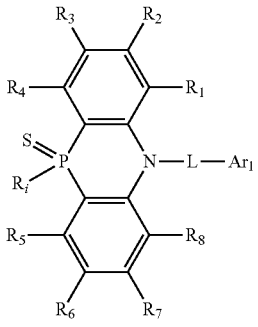

[Formula 1-10]

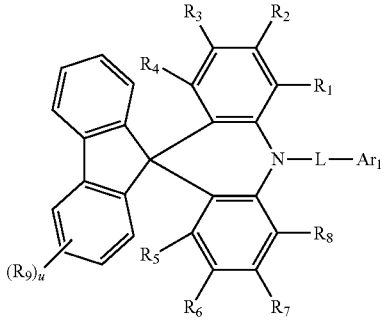

In Formula 1-10, $R_9$ is a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, u is an integer of 0 to 4, and $Ar_1$, L, $R_1$ to $R_8$, and $R_a$ to $R_i$ are the same as defined in Formula 1.

In an embodiment, $R_a$ to $R_i$ may be each independently unsubstituted or substituted with at least one of a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

In an embodiment, $R_a$ to $R_i$ may be each independently represented by one of the following Formulae 2-1 to 2-4.

[Formula 2-1]

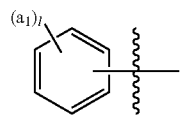

[Formula 2-2]

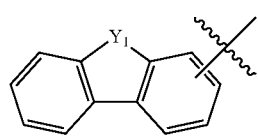

[Formula 2-3]

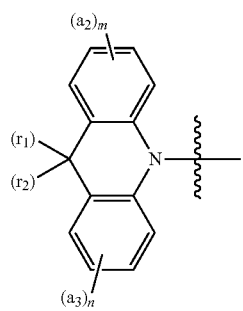

[Formula 2-4]

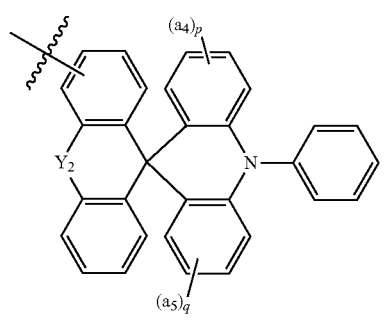

In Formulae 2-1 to 2-4, $a_1$ to $a_5$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, $r_1$ and $r_2$ are each independently a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, l, m, n, p, and q are each independently an integer of 0 to 4. In Formula 2-2, $Y_1$ is $NR_a$, O, or S. In Formula 2-4, $Y_2$ is a direct linkage, O, or S, and $R_a$ is the same as defined in Formula 1.

In an embodiment, $Ar_i$ may be represented by the following Formula 3-1 or 3-2.

[Formula 3-1]

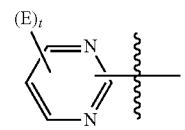

[Formula 3-2]

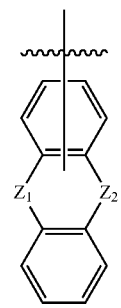

In Formula 3-1, E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, and t is an integer of 0 to 3.

In Formula 3-2, $Z_1$ and $Z_2$ are each independently BR', NR'', O, S, or C(=O), and R' and R'' are each independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring.

In an embodiment, each of $R_a$ to $R_i$ may independently be represented by one of the following Formulae S1 to S18.

S1

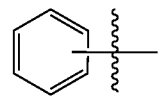

S2

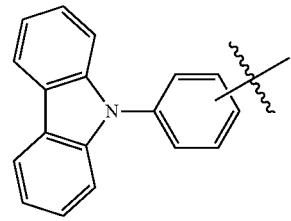

S3

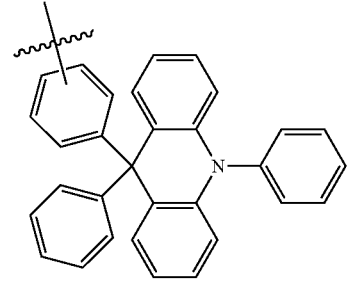

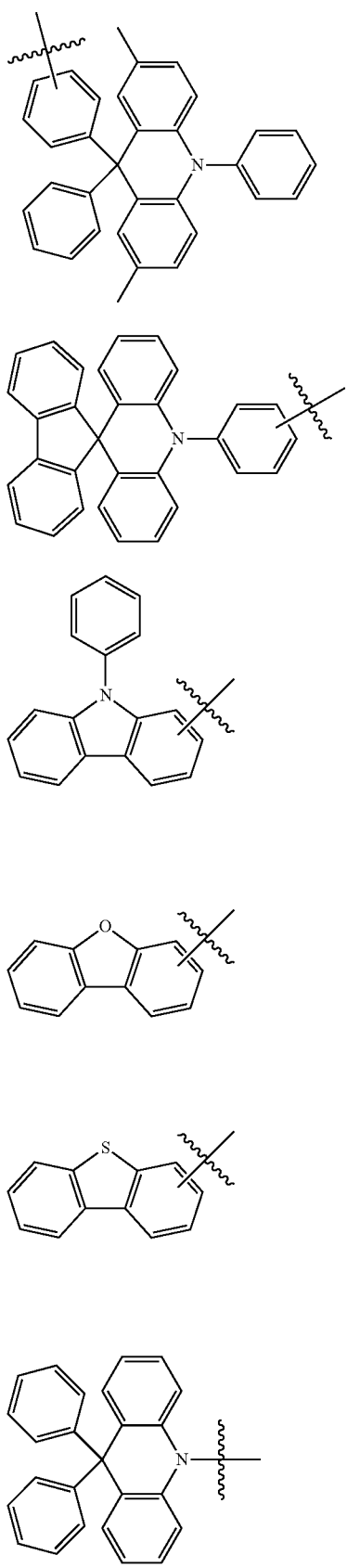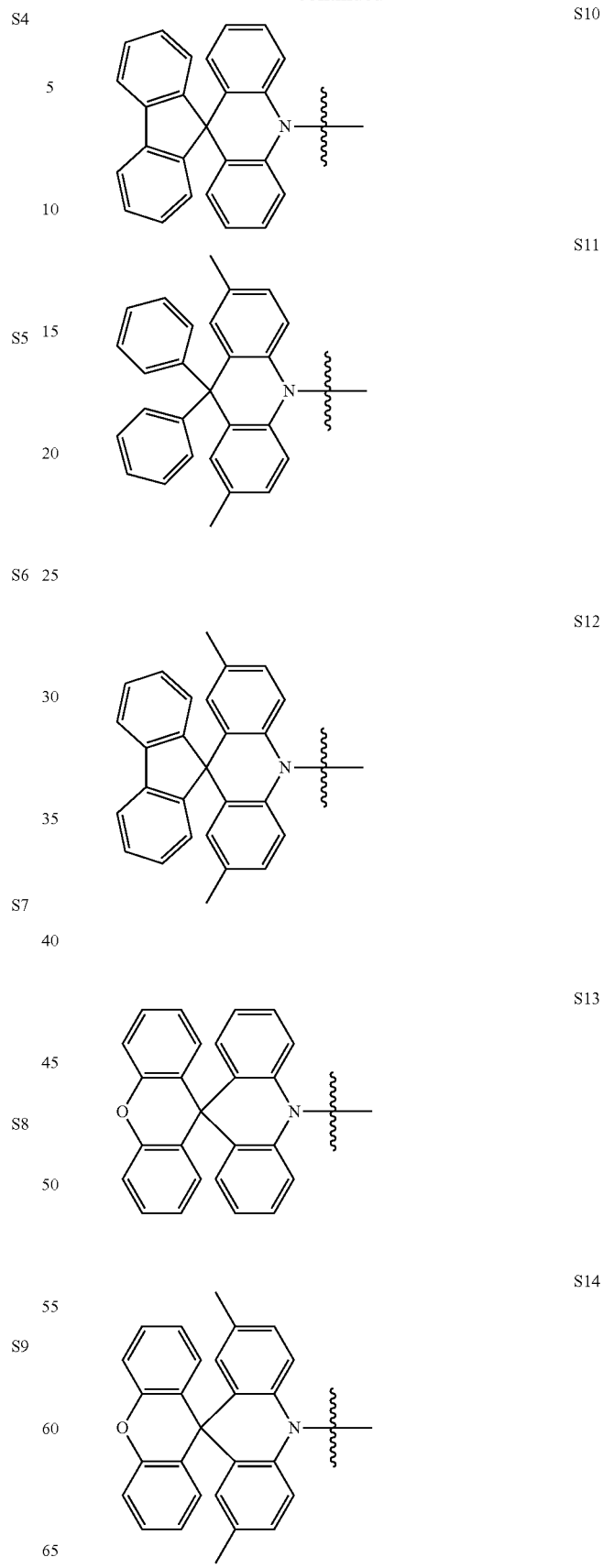

-continued

S15

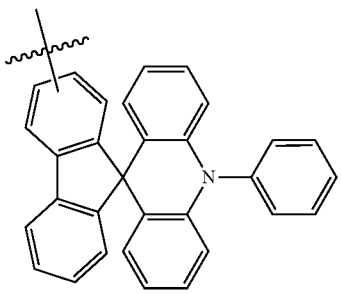

S16

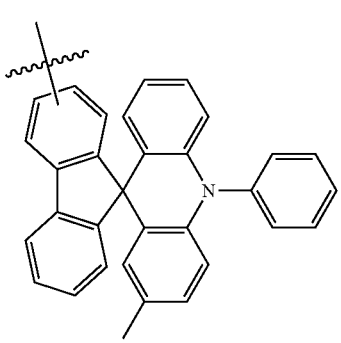

S17

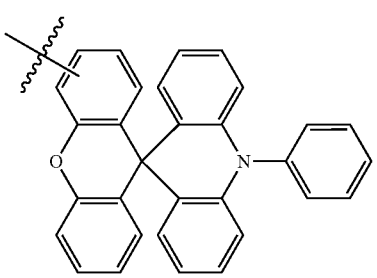

S18

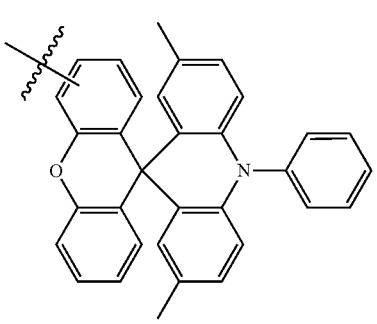

In an embodiment, Formula 1 may be represented by the following Formula 4.

[Formula 4]

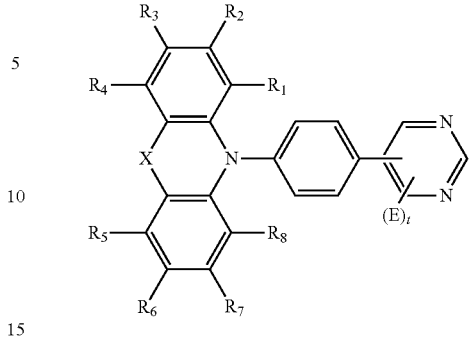

In Formula 4, E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, t is an integer of 0 to 3, and X and $R_1$ to $R_8$ are the same as defined in Formula 1.

In an embodiment, Formula 1 may be represented by the following Formula 5.

[Formula 5]

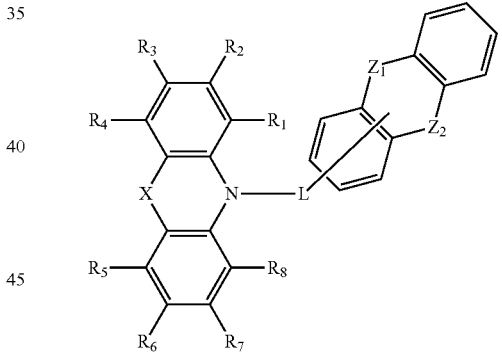

In Formula 5, $Z_1$ and $Z_2$ are each independently BR', NR", O, S, or C(=O), R' and R" are each independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, and X, L, and $R_1$ to $R_8$ are the same as defined in Formula 1.

In an embodiment, the aromatic compound represented by Formula 1 may be one selected from the group consisting of compounds represented in the following Compound Group 1.

[Compound Group 1]
1
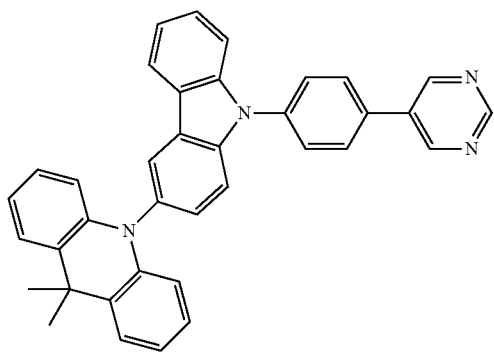
2
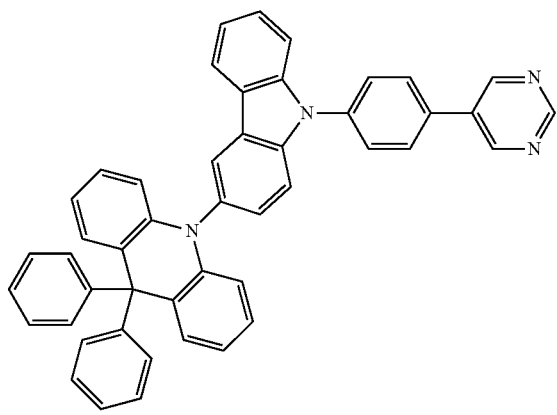
3
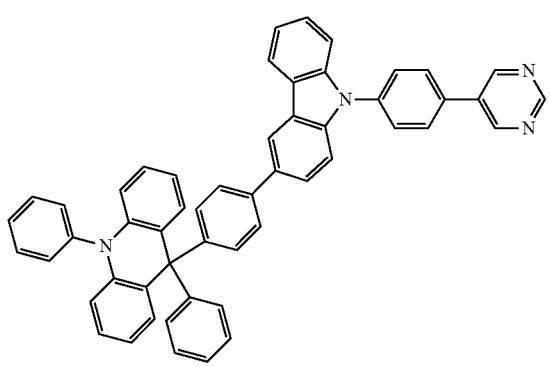
4
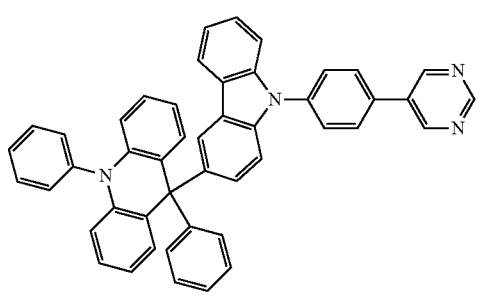
5
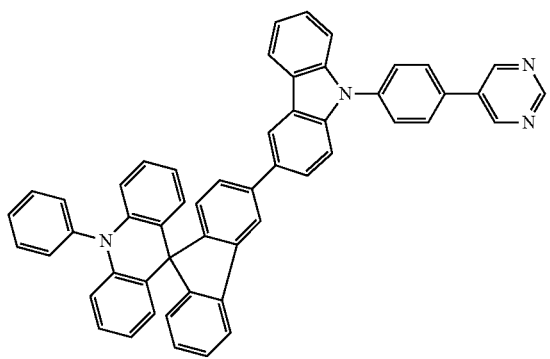
6
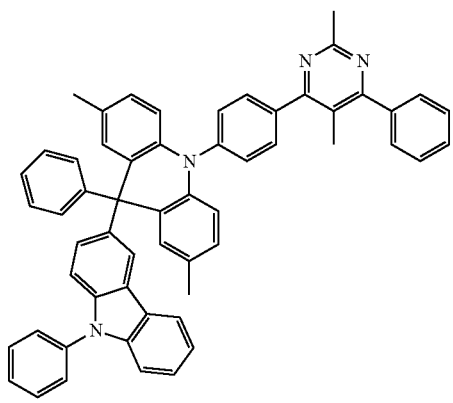
7
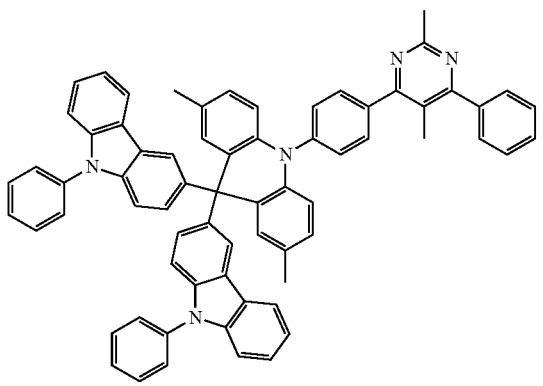
8
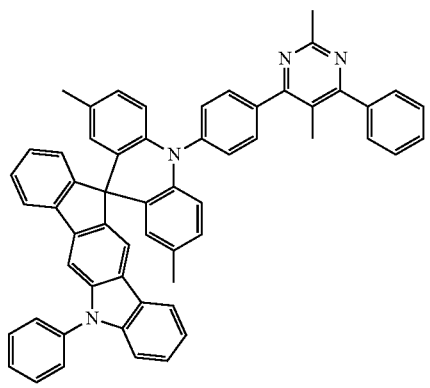

-continued
9
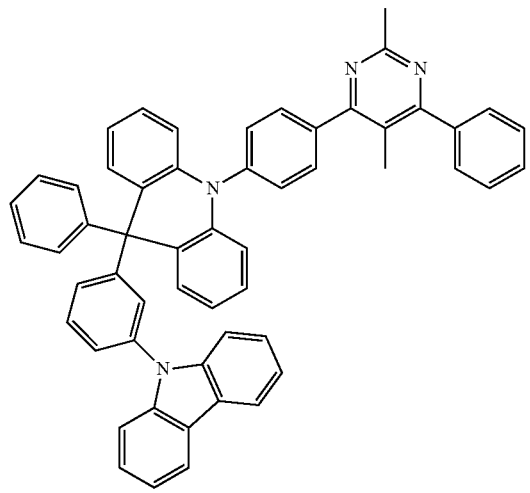
10
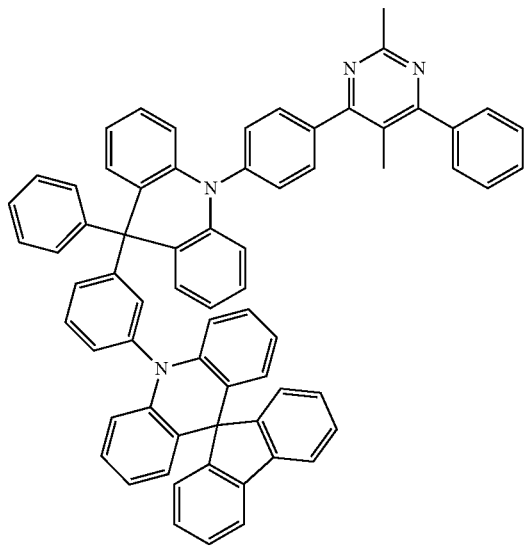
11
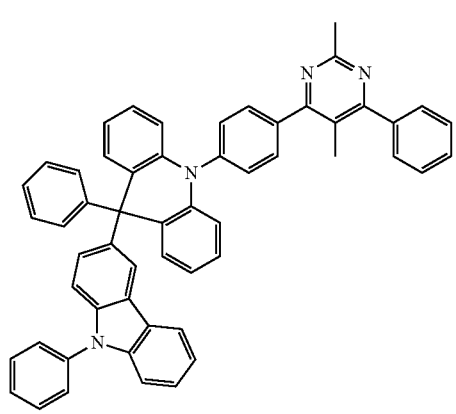
12
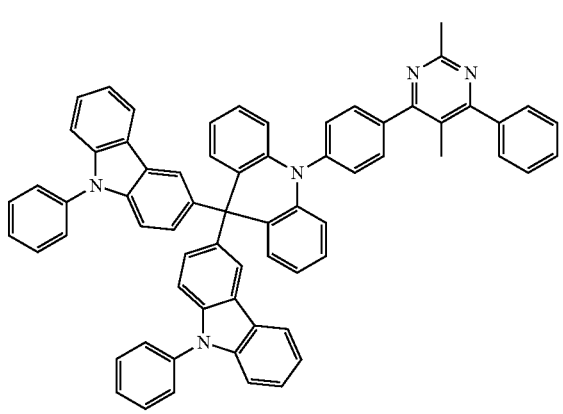
13
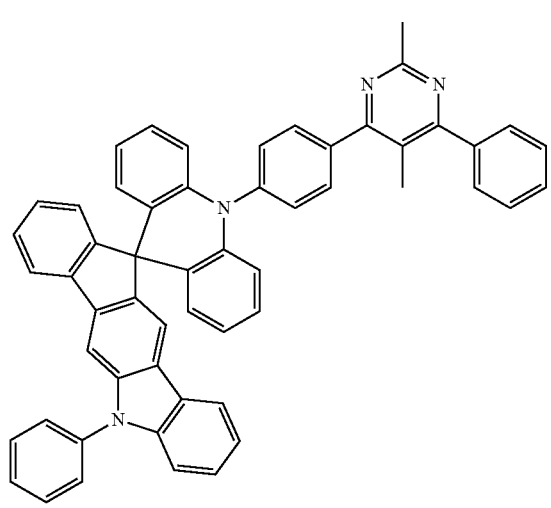
14
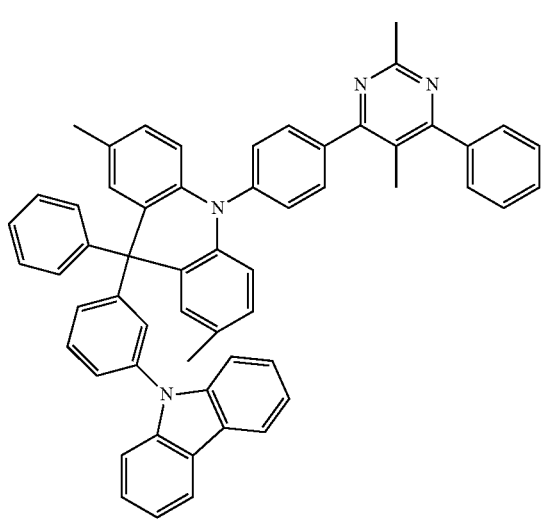

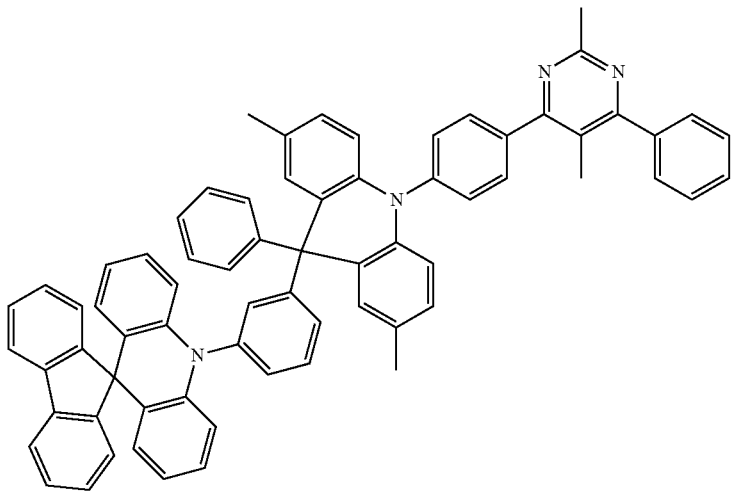
15
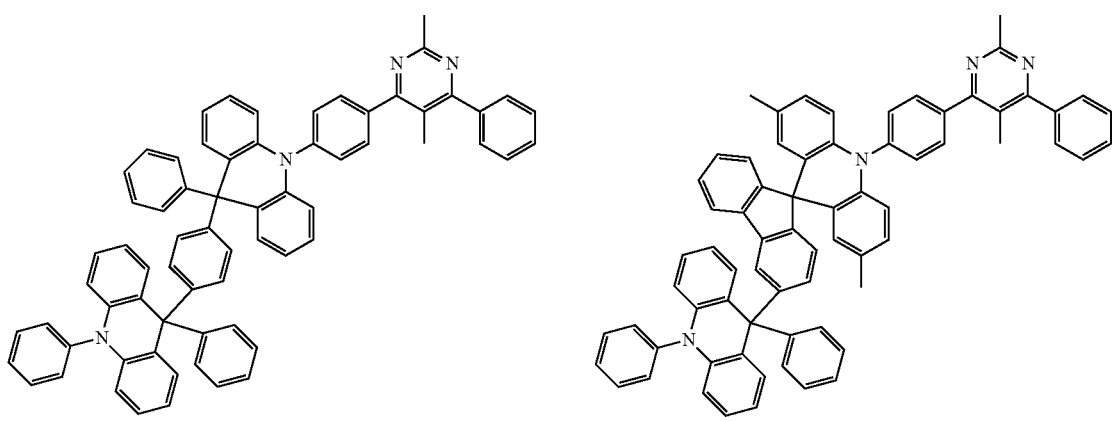
16
17
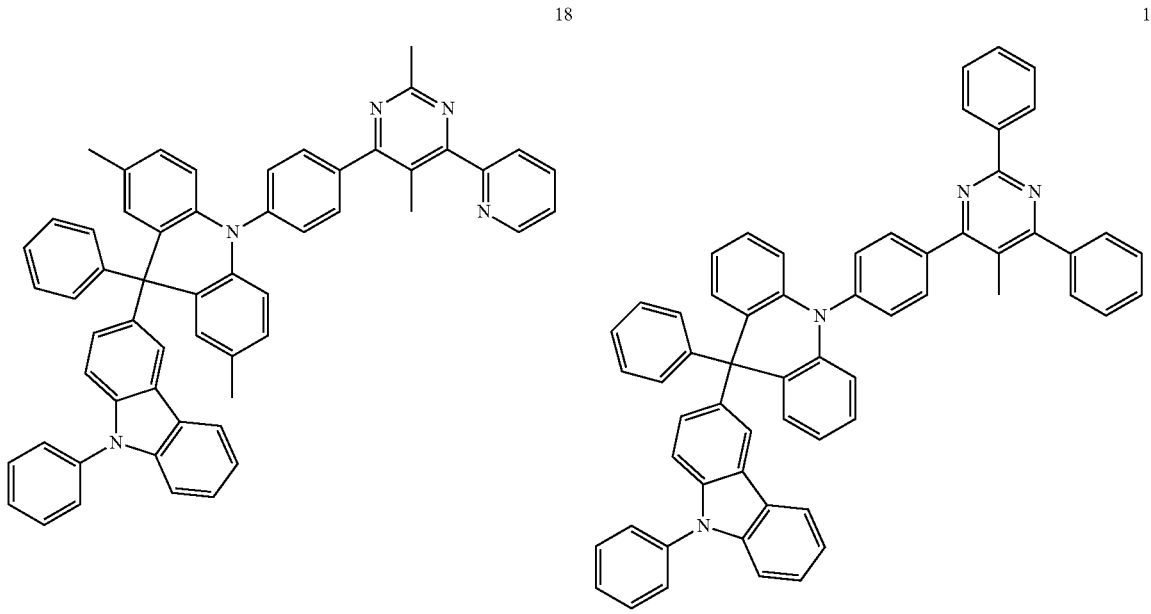
18
19

-continued
20
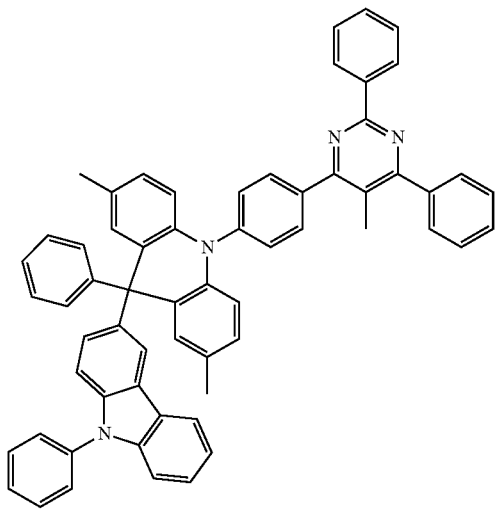
21
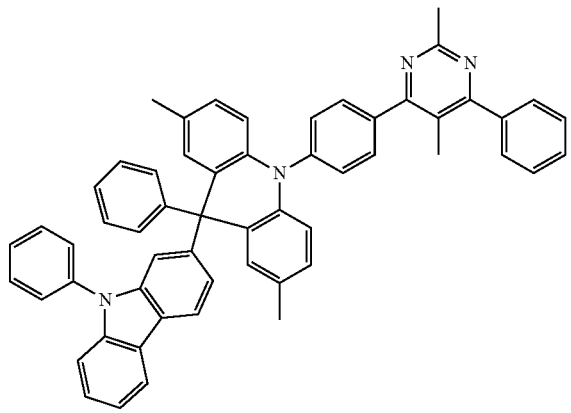
22
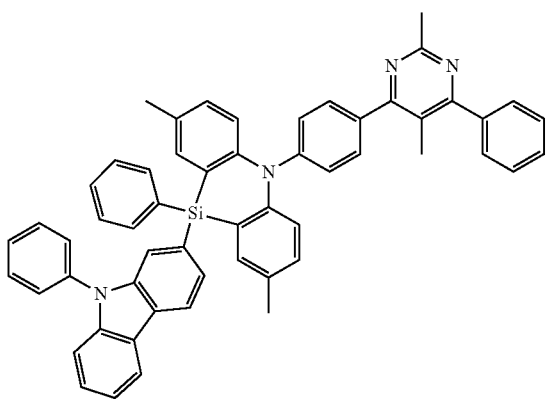
23
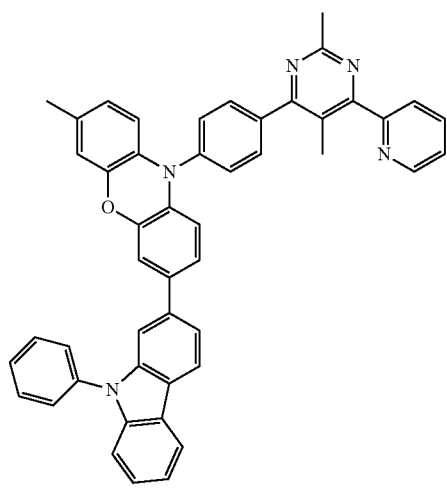
24
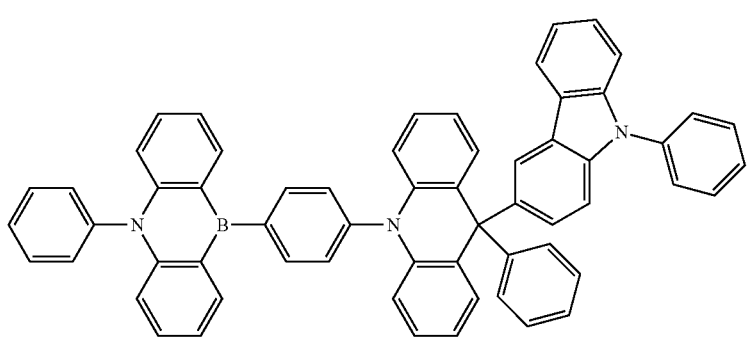

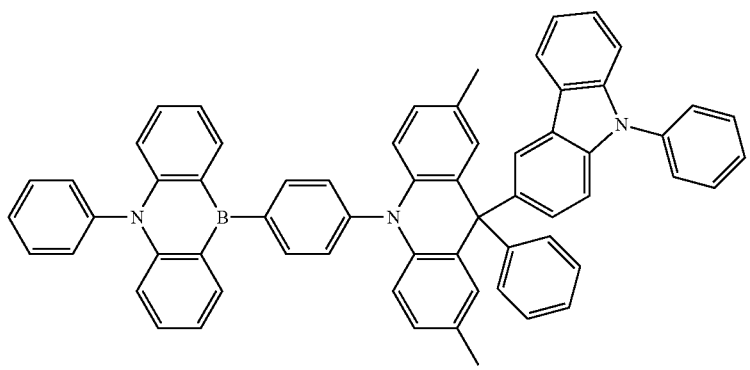

25

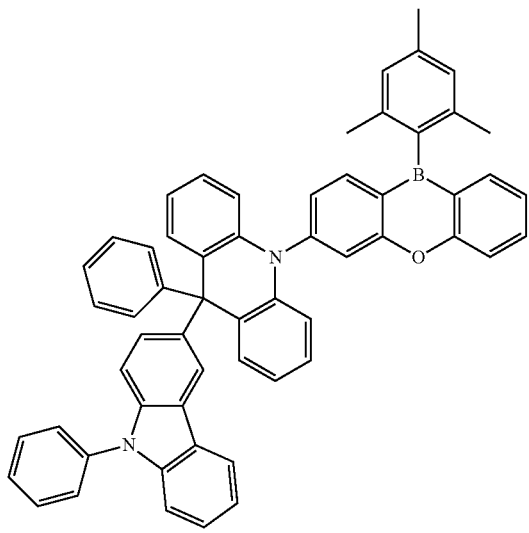

26

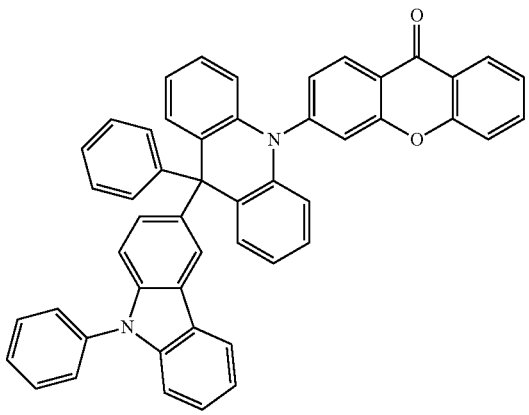

27

An embodiment of the inventive concept provides an organic electroluminescence device including a first electrode, a hole transport region disposed on the first electrode, an emission layer disposed on the hole transport region, an electron transport region disposed on the emission layer, and a second electrode disposed on the electron transport region, in which the emission layer includes an aromatic compound represented by the following Formula 1. And the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof.

[Formula 1]

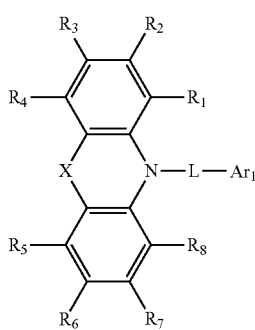

In Formula 1, $Ar_1$ is a substituted or unsubstituted heteroaryl group having 4 to 30 carbon atoms for forming a ring, L is a direct linkage, or a substituted or unsubstituted phenylene group, X is a direct linkage, O, S, $NR_a$, $CR_bR_c$, $SiR_dR_e$, $GeR_fR_g$, $P(=O)R_h$, or $P(=S)R_i$.

In Formula 1, $R_1$ to $R_8$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

In Formula 1, $R_a$ to $R_i$ are each independently a hydrogen atom, a deuterium atom, a halogen atom, a substituted or unsubstituted silyl group, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, and $R_d$ and $R_e$ are not phenyl group concurrently.

In an embodiment, the emission layer may emit blue light.

In an embodiment, the aromatic compound represented by Formula 1 may be a thermally activated delayed fluorescence compound.

In an embodiment, the aromatic compound represented by Formula 1 may have an absolute value of the difference between the singlet energy level and the triplet energy level of about 0.2 eV or less.

In an embodiment, the emission layer may include at least one of the compounds represented in the following Compound Group 1:
[Compound Group 1]
1
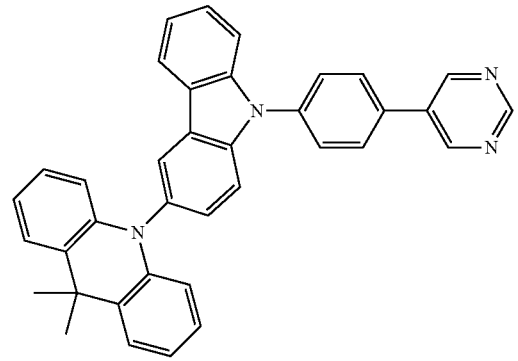
2
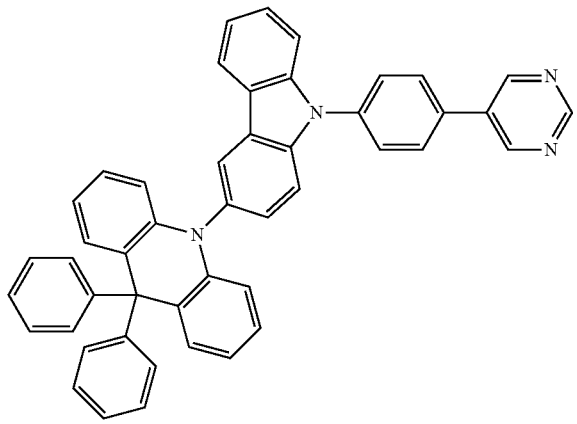
3
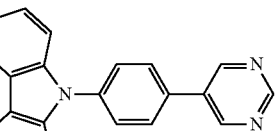
-continued
4
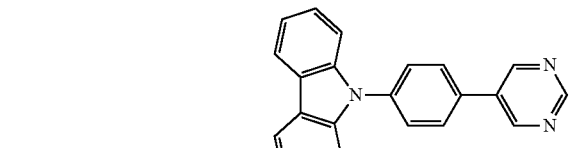
5
6
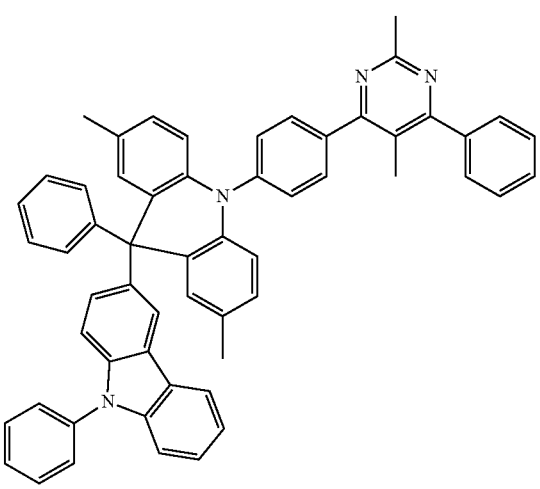

7
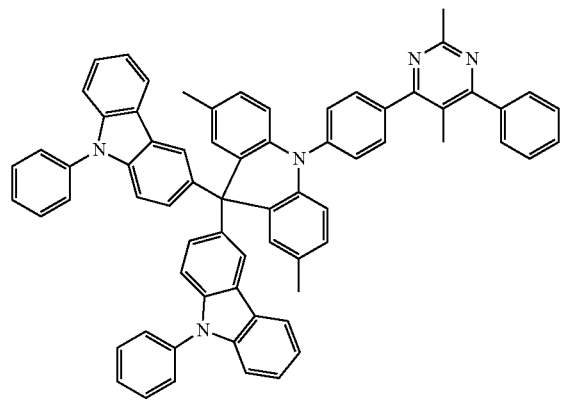
8
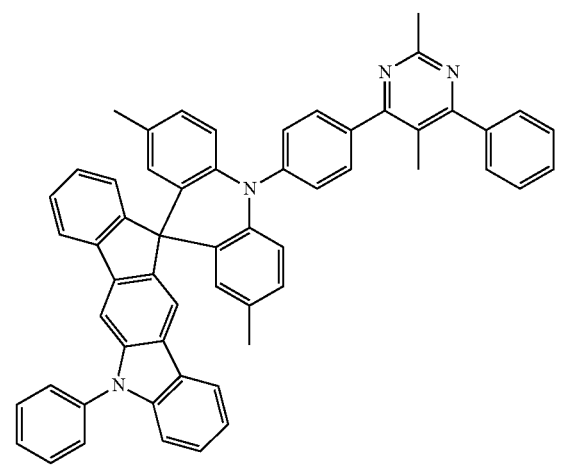
9
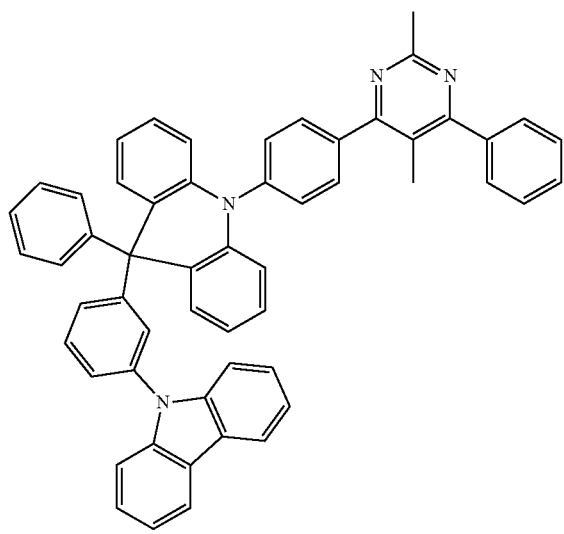
10
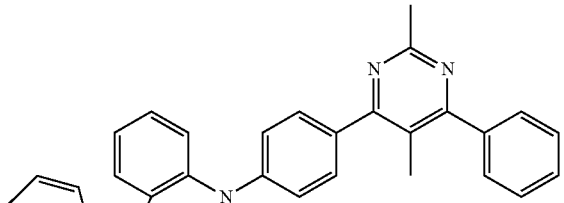
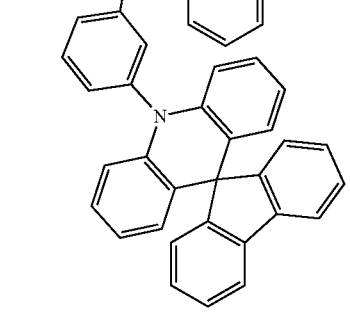
11
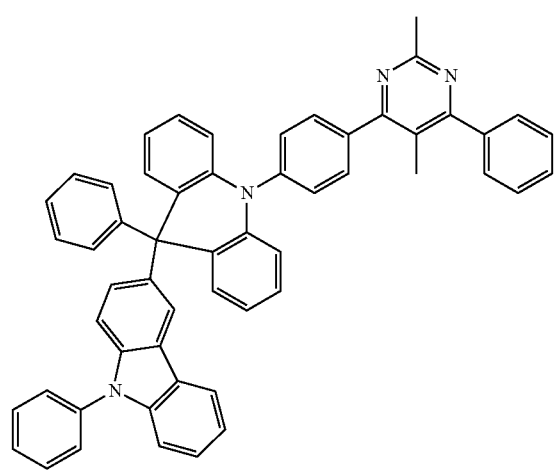
12
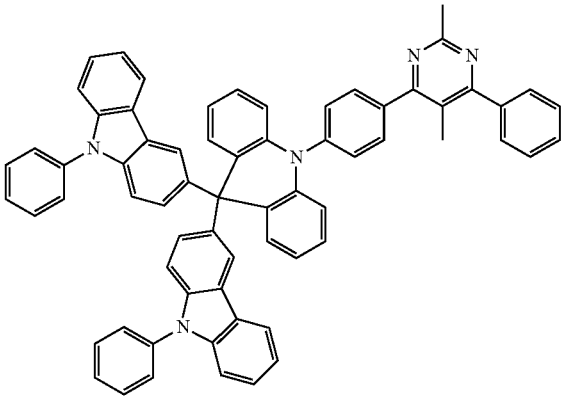

13
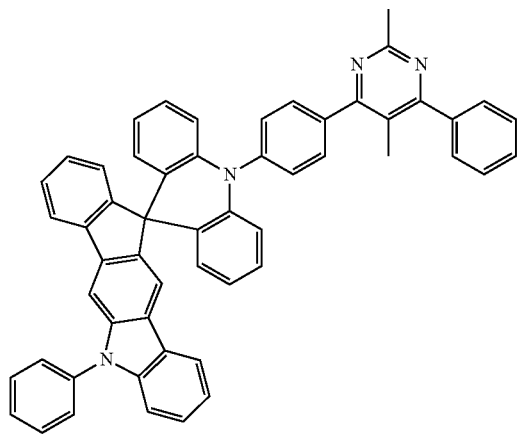
14
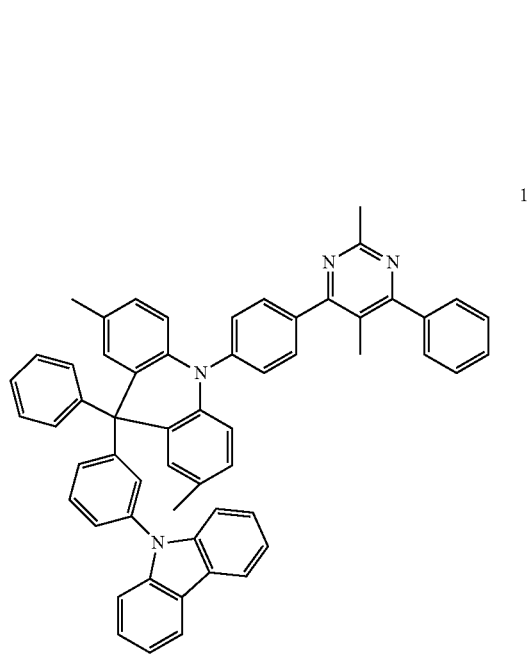
15
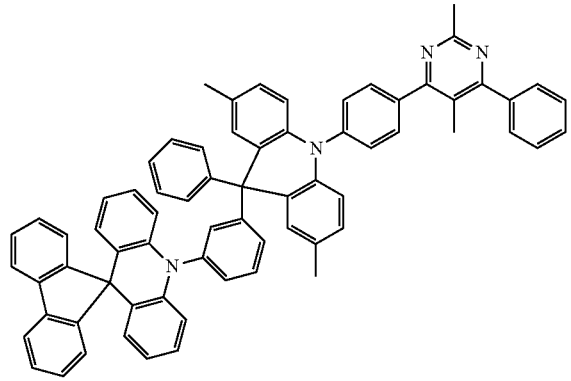
16
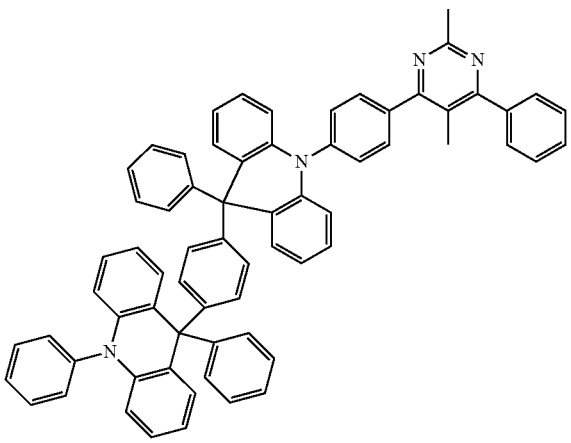
17
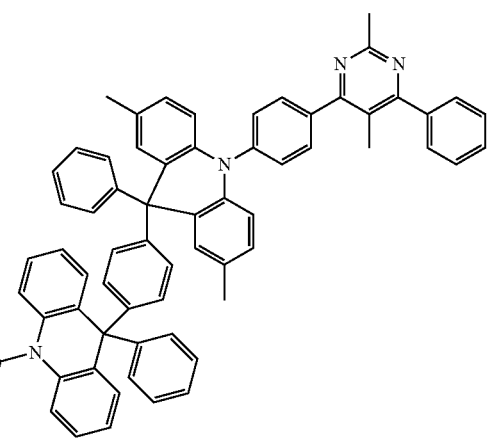
18
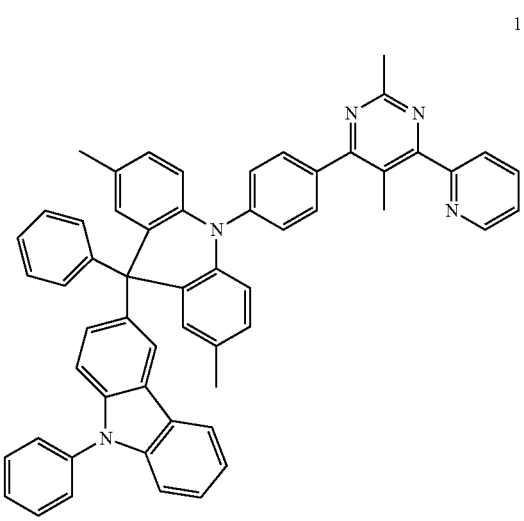

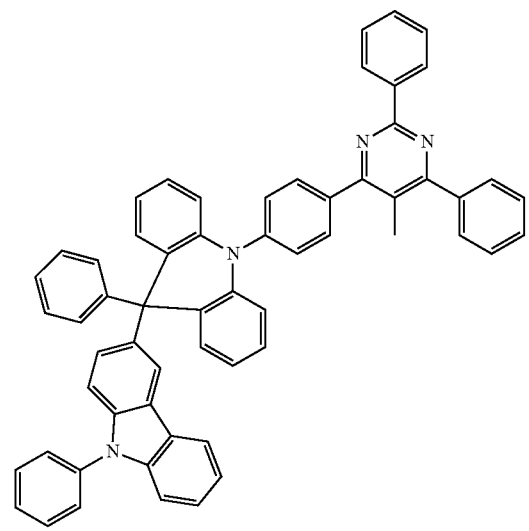
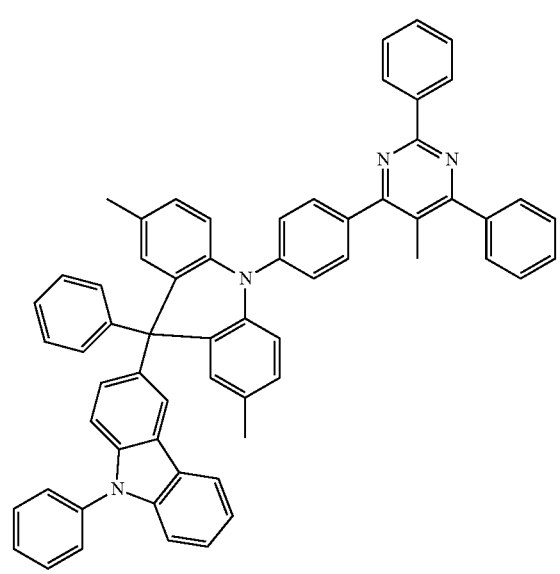
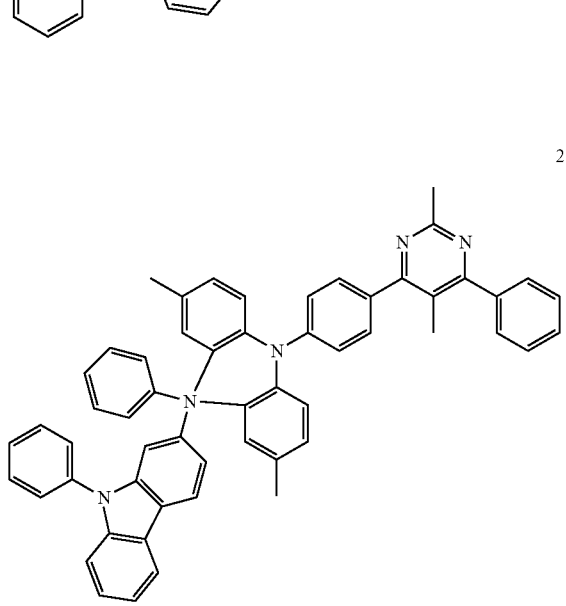
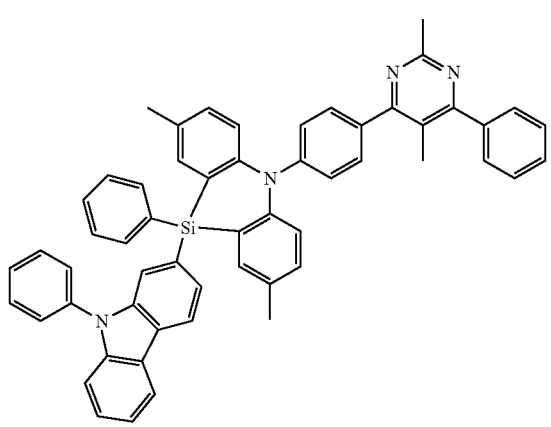
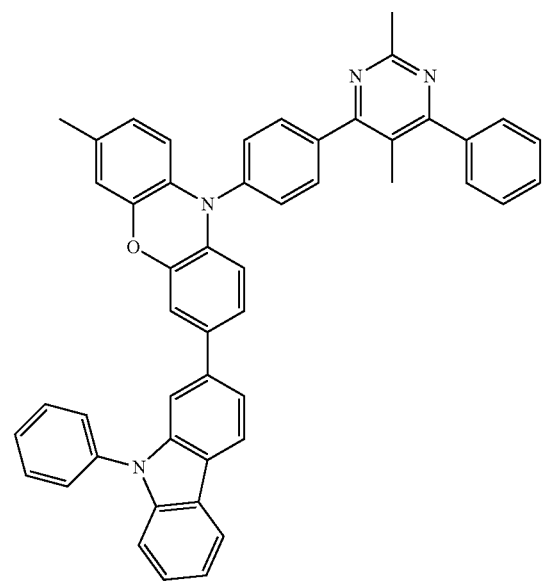
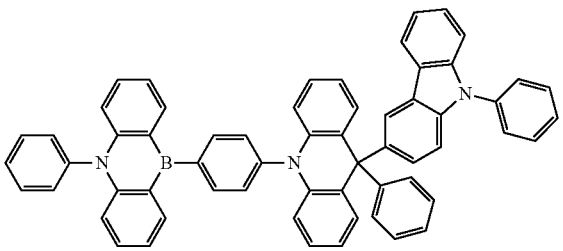
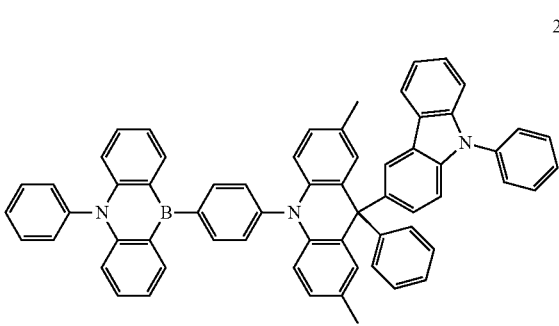

-continued

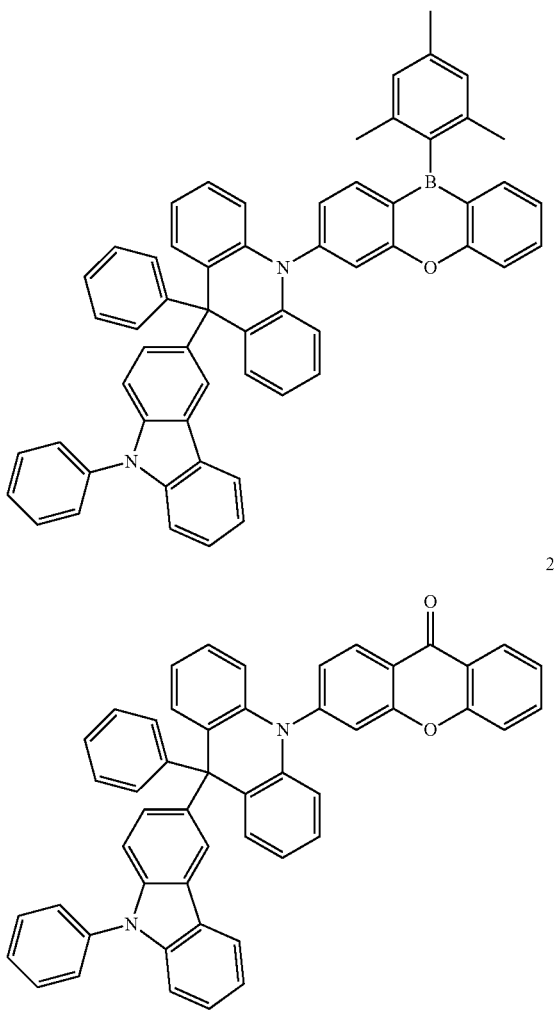

26

27

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
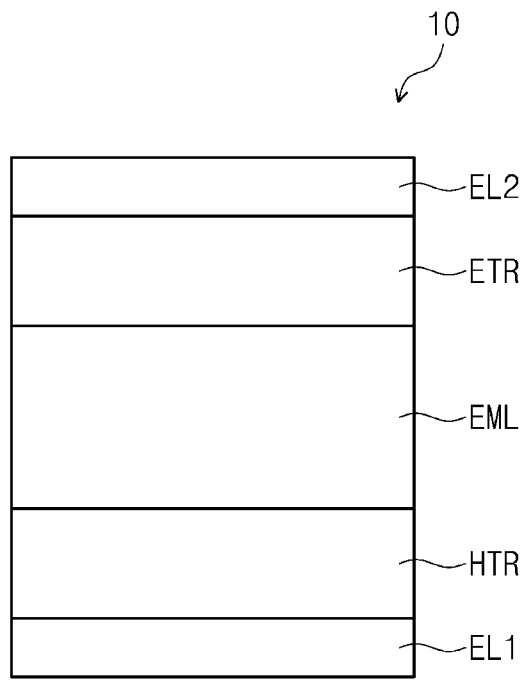
FIG. 1 is a schematic cross-sectional view of an organic electroluminescence device according to an embodiment of the inventive concept.

Exemplary embodiments of the inventive concept will be described below in more detail with reference to the accompanying drawings, since the inventive concept may be embodied in different forms. However, the inventive concept should not be construed as limited to the embodiments set forth herein. Rather, it should be understood that the scope of the inventive concept includes all modification, equivalents and alternatives within the spirit and scope of the inventive concept as hereinafter claimed.

Like reference numerals refer to like elements for explaining each drawing. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be directly on the other part, or intervening layers may also be present. On the contrary, when a layer, a film, a region, a plate, etc. is referred to as being "under" another part, it can be directly under the other part, or intervening layers may also be present.

In the present disclosure,

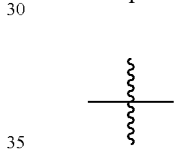

means a part to be connected.

In the present disclosure, "substituted or unsubstituted" may mean unsubstituted or substituted with at least one substituent selected from the group consisting of deuterium, halogen, nitro, amino, silyl, boron, phosphine oxide, phosphine sulfide, alkyl, alkenyl, aryl and heterocycle group. In addition, each of the substituent illustrated above may be substituted or unsubstituted. For example, biphenyl may be interpreted as aryl, or phenyl substituted with phenyl.

In the present disclosure, "forming a ring by combining adjacent groups with each other" may mean forming a substituted or unsubstituted hydrocarbon ring or a substituted or unsubstituted heterocycle by combining adjacent groups with each other. A hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or polycycle. In addition, the ring formed by combining adjacent groups with each other may be connected with another ring to form a spiro structure.

In the present disclosure, "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quingphenyl, sexiphenyl, triphenylene, pyrenyl, benzofluoranthenyl, chrysenyl, etc., without limitation.

In the present disclosure, the fluorenyl group may be substituted, and two substituents may be combined with each other to form a spiro structure.

In the present disclosure, the heteroaryl group may be heteroaryl including at least one of O, N, P, Si, or S as a heteroatom. The carbon number of the heteroaryl group for forming a ring may be 2 to 30, or 2 to 20. The heteroaryl group may be monocyclic heteroaryl or polycyclic heteroaryl. Polycyclic heteroaryl may have bicyclic or tricyclic structure, for example. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophenyl, thienothiophene, benzofuranyl, phenanthroline, thiazolyl, isoxazolyl, oxadiazolyl, thiadiazolyl, benzothiazolyl, phenothiazinyl, dibenzosilole, dibenzofuranyl, etc., without limitation.

In the present disclosure, the above explanation on the aryl group may be applied to the arylene group, except that the arylene is divalent.

The above explanation on the heteroaryl group may be applied to the heteroarylene group, except that the heteroarylene is divalent.

In the present disclosure, the carbon number of the amino group is not specifically limited, and may be 1 to 30. The amino group may include alkyl amino and aryl amino. Examples of the amino group may include methylamino, dimethylamino, phenylamino, diphenylamino, naphthylamino, 9-methyl-anthracenylamino, triphenylamino, etc., without limitation.

Hereinafter, the aromatic compound according to an embodiment of the inventive concept will be explained.

The aromatic compound according to an embodiment of the inventive concept is represented by the following Formula 1.

[Formula 1]

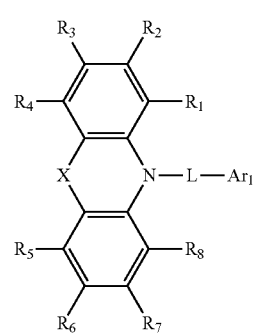

In Formula 1, $Ar_1$ is a substituted or unsubstituted heteroaryl group having 4 to 30 carbon atoms for forming a ring, L is a direct linkage, or a substituted or unsubstituted phenylene group, and X may be a direct linkage, O, S, $NR_a$, $CR_bR_c$, $SiR_dR_e$, $GeR_fR_g$, $P(=O)R_h$, or $P(=S)R_i$.

In the present disclosure, a direct linkage may be, for example, a single bond. For example, L may be a direct linkage or an unsubstituted phenylene group.

In Formula 1, each of $R_1$ to $R_8$ may independently be a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

In addition, $R_a$ to $R_i$ are each independently a hydrogen atom, a deuterium atom, a halogen atom, a substituted or unsubstituted silyl group, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or may form a ring by combining adjacent groups with each other. Meanwhile, $R_d$ and $R_e$ are not phenyl group concurrently.

In case X is $CR_bR_e$, each of $R_b$ and $R_e$ may independently be a substituted or unsubstituted alkyl group having 1 to 20 carbon atoms, or a substituted or unsubstituted aryl group having 6 to 30 carbon atoms for forming a ring. Each of $R_b$ and $R_e$ may independently be a methyl group or a phenyl group. $R_b$ and $R_e$ may form a ring by combining with each other. $R_b$ and $R_e$ may combine with each other to form a fluorene ring.

In case X is $SiR_dR_e$, each of $R_d$ and $R_e$ may independently be a substituted or unsubstituted aryl group having 6 to 30 carbon atoms for forming a ring, or a substituted or unsubstituted heteroaryl group having 4 to 30 carbon atoms for forming a ring. Each of $R_d$ and $R_e$ may independently be a substituted or unsubstituted phenyl group, or a substituted or unsubstituted carbazole group. Meanwhile, a case where $R_d$ and $R_e$ are both simultaneously an unsubstituted phenyl group is excluded.

When X is a direct linkage, the following moiety connected to L in Formula 1 may be a substituted or unsubstituted carbazole group represented by following formula.

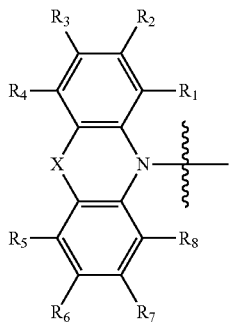

In Formula 1, each of $R_1$ to $R_8$ may independently be a hydrogen atom, a methyl group, a substituted or unsubstituted fluorenyl group, or a substituted or unsubstituted nitrogen-containing heteroaryl group having 4 to 30 carbon atoms for forming a ring. For example, a nitrogen-containing heteroaryl group may be a substituted or unsubstituted carbazole group or a substituted or unsubstituted acridyl group.

The aromatic compound represented by Formula 1 according to an embodiment of the inventive concept may include an electron acceptor, a linker and an electron donor. For example, in the aromatic compound represented by Formula 1, $Ar_1$ may be an electron acceptor and L may be a linker.

Furthermore, in Formula 1, the following moiety may correspond to an electron donor.

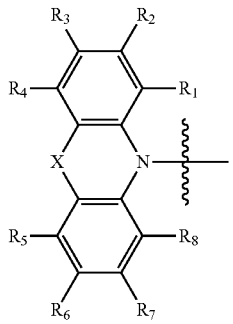

The aromatic compound according to an embodiment of the inventive concept may be an organic electroluminescence device material having an absolute value of the difference between the singlet energy level and the triplet energy level of about 0.2 eV or less.

The aromatic compound according to an embodiment of the inventive concept may be a luminescence material for thermally activated delayed fluorescence (TADF). Particularly, the aromatic compound according to an embodiment of the inventive concept may be a luminescence material for thermally activated delayed fluorescence emitting blue light.

The aromatic compound represented by Formula 1 according to an embodiment of the inventive concept may be represented by one of the following Formulae 1-1 to 1-10.

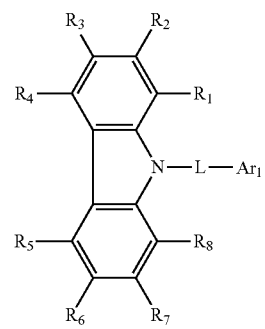

[Formula 1-1]

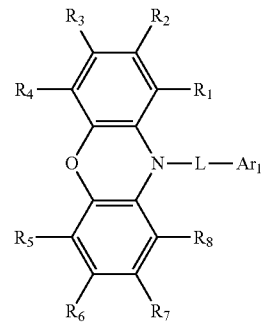

[Formula 1-2]

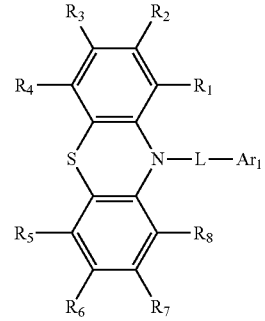

[Formula 1-3]

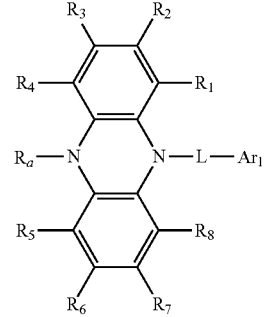

[Formula 1-4]

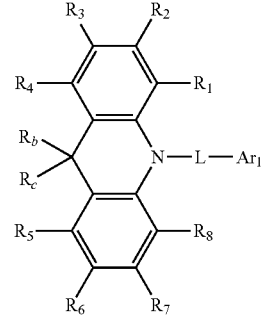

[Formula 1-5]

[Formula 1-6]
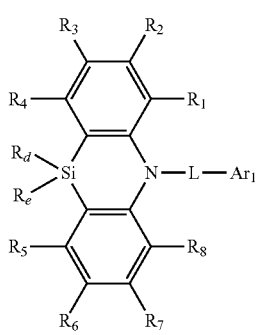

[Formula 1-7]
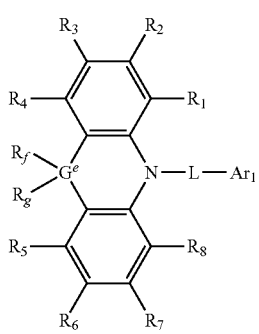

[Formula 1-8]
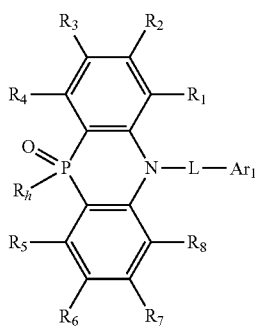

[Formula 1-9]
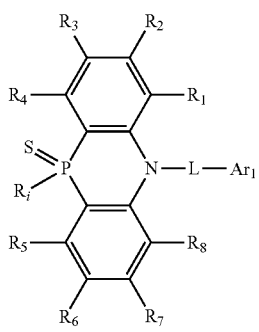

[Formula 1-10]
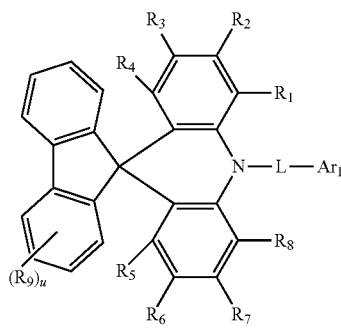

In Formulae 1-1 to 1-10, $Ar_1$, L, $R_1$ to $R_8$ and $R_a$ to $R_i$ may be the same as defined in Formula 1.

In Formula 1-10, $R_9$ is a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, or may form a ring by combining adjacent groups with each other. u is an integer between 0 and 4, inclusive. When u is an integer of 2 or more, a plurality of $R_9$ may be the same or different from each other.

In the aromatic compound according to an embodiment of the inventive concept represented by Formula 1, or Formulae 1-1 to 1-10, each of $R_a$ to $R_i$ may independently be unsubstituted or substituted with at least one substituent of a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

That is, each of $R_a$ to $R_i$ may independently be unsubstituted or substituted with at least one substituent selected from the group consisting of a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

Each of $R_a$ to $R_i$ may independently be represented by one of the following Formulae 2-1 to 2-4.

[Formula 2-1]
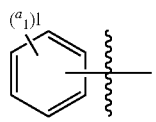

[Formula 2-2]
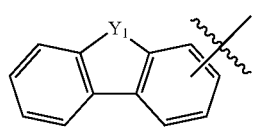

[Formula 2-3]
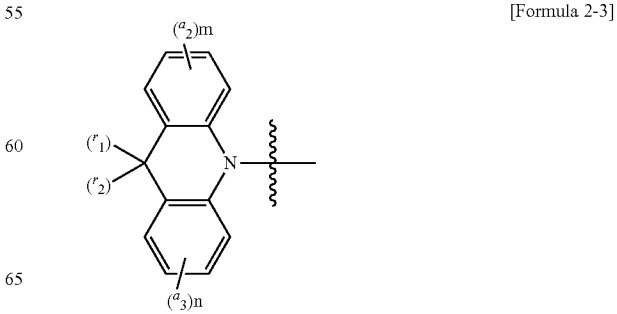

[Formula 2-4]

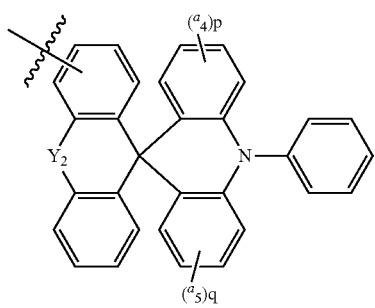

In Formulae 2-1 to 2-4, $a_1$ to $a_5$ may each independently be a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring. For example, $a_1$ to $a_5$ may each independently be a methyl group, a substituted or unsubstituted phenyl group, or a substituted or unsubstituted carbazole group. In case each of $a_1$ to $a_5$ is a number greater than 1, each of $a_1$ to $a_5$ may be the same or different from each other.

Each of $r_1$ and $r_2$ is independently a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or may form a ring by combining adjacent groups with each other.

Each of l, m, n, p and q may independently be an integer between 0 and 4, inclusive.

$Y_1$ is $NR_a$, O, or S, and $R_a$ may be the same as defined in Formula 1. $Y_2$ may be a direct linkage, O or S.

In the aromatic compound according to an embodiment of the inventive concept represented by Formula 1, or Formulae 1-1 to 1-10, each of $R_a$ to $R_i$ may independently be a substituted or unsubstituted phenyl group, a substituted or unsubstituted fluorenyl group, or a substituted or unsubstituted carbazole group. For example, each of $R_a$ to $R_i$ may independently be a phenyl group or a phenyl carbazole group.

For example, $R_a$ to $R_i$ may be a hole transport functional group. Specifically, when a phenyl carbazole group is used as $R_a$ to $R_i$, the phenyl carbazole group may be a hole transport functional group.

In the aromatic compound according to an embodiment of the inventive concept represented by Formula 1, or Formulae 1-1 to 1-10, each of $R_a$ to $R_i$ may independently be represented by one of the following Formulae S1 to S18.

S1

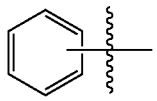

S2

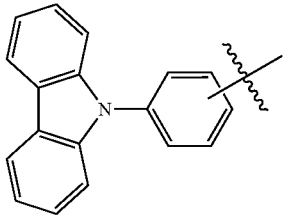

S3

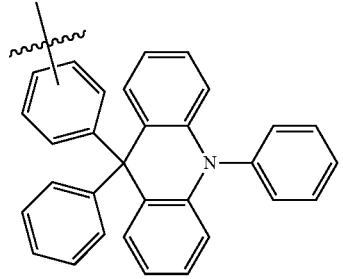

S4

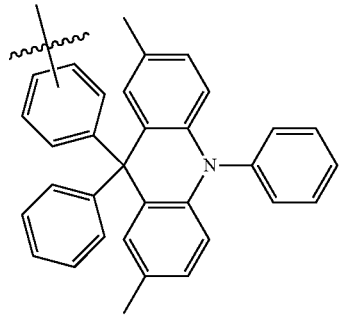

S5

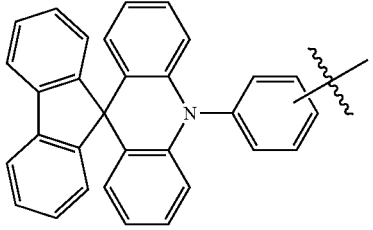

S6

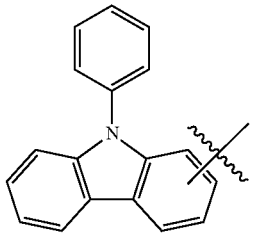

S7

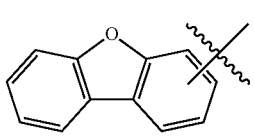

S8

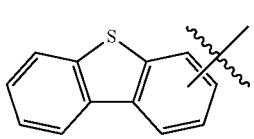

-continued
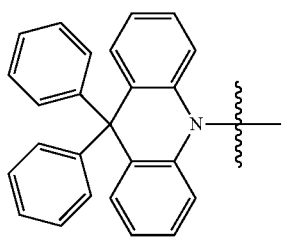
S9
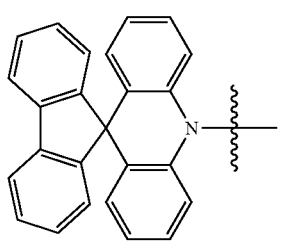
S10
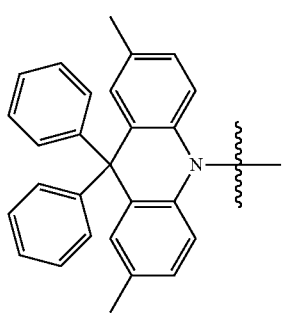
S11
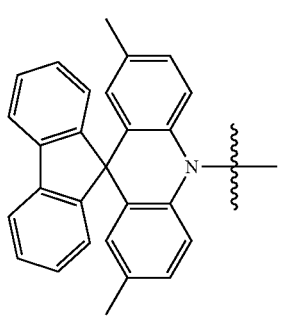
S12
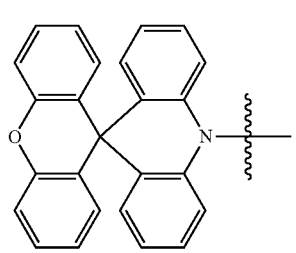
S13
-continued
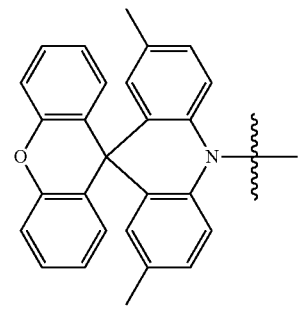
S14
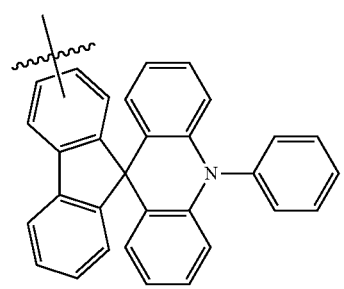
S15
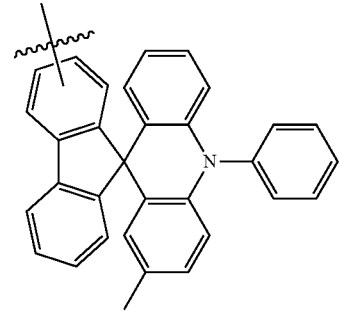
S16
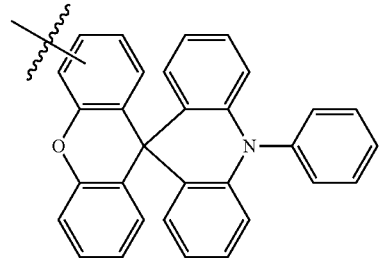
S17
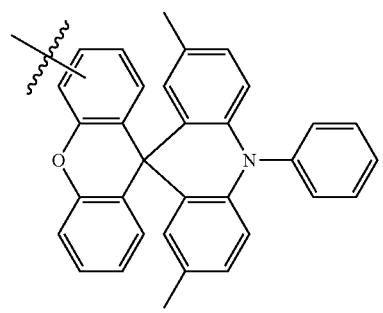
S18
In the aromatic compound according to an embodiment of the inventive concept represented by Formula 1 or Formulae 1-1 to 1-10, $Ar_1$ may be an unsubstituted heteroaryl group having 4 to 30 carbon atoms for forming a ring. Alternatively, $Ar_1$ may be a substituted heteroaryl group having 4 to 30 carbon atoms for forming a ring. A heteroaryl group $Ar_1$ may be unsubstituted or substituted with a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring. For example, $Ar_1$ may include a methyl group, a substituted or unsubstituted phenyl group, or a substituted or unsubstituted pyridyl group as a substituent. $Ar_1$ may be represented by the following Formula 3-1 or 3-2.

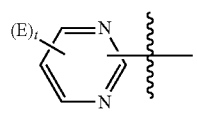

[Formula 3-1]

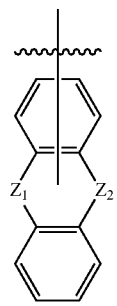

[Formula 3-2]

In Formula 3-1, E may be a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

For example, E may be a methyl group, a substituted or unsubstituted phenyl group, or a substituted or unsubstituted pyridyl group.

In Formula 3-1, t may be an integer between 0 and 3, inclusive. In case t is 2 or 3, a plurality of E may be the same or different from each other. For example, in case t is 2, two E's may be the same or different from each other. In addition, in case t is 3, three E's may be different from each other, two E's may be the same and one E may be different, or all three E's may be the same.

In Formula 3-2, $Z_1$ and $Z_2$ may each independently be BR', NR", O, S, or C(=O). In this case, each of R' and R" is independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring.

For example, $Ar_1$ represented by Formula 3-2 may be any one of the following Compounds A-1 to A-3, each of which may be substituted or unsubstituted. When the following compounds are substituted, the substituent may be, for example, a methyl group, etc.

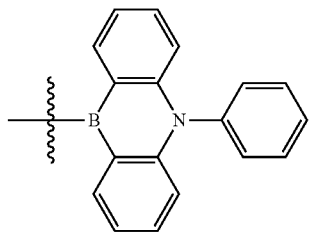

A-1

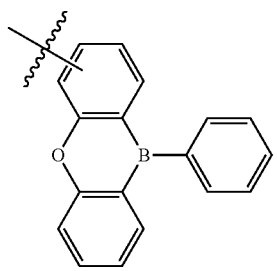

A-2

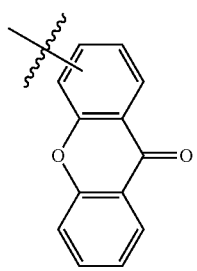

A-3

In the aromatic compound according to an embodiment of the inventive concept, $Ar_i$ represented by Formula 3-1 or 3-2 may be a heteroaryl group including at least one hetero atom and may serve as an electron acceptor.

The aromatic compound represented by Formula 1 according to an embodiment of the inventive concept may be represented by the following Formula 4.

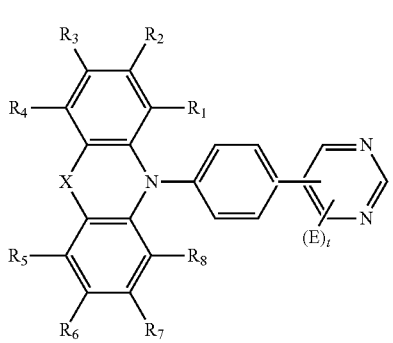

[Formula 4]

In Formula 4, E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, and t may be an integer between 0 and 3, inclusive.

In case t is an integer of 2 or more, a plurality of E may be the same or different from each other. In addition, in case t is 3, three E's may be different from each other, or at least two E's may be the same.

For example, in Formula 4, E may be a methyl group, a substituted or unsubstituted phenyl group, or a substituted or unsubstituted pyridyl group.

In Formula 4, the explanation on Formula 1 may be applied to X and $R_1$ to $R_8$.

The aromatic compound represented by Formula 1 according to an embodiment of the inventive concept may be represented by the following Formula 5.

[Formula 5]

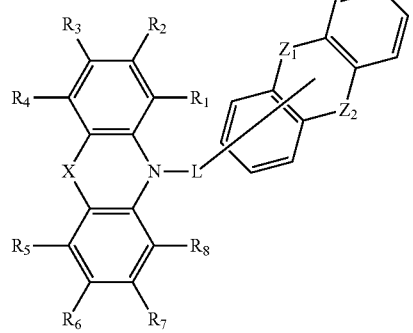

In Formula 5, each of $Z_1$ and $Z_2$ is independently BR', NR'', O, S, or C(=O), each of R' and R'' may independently be a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring. In Formula 5, the explanation on Formula 1 may be applied to X, L, and $R_1$ to $R_8$.

In Formula 5, L may be connected with any one of $Z_1$ or $Z_2$.

The aromatic compound represented by Formula 1 according to an embodiment of the inventive concept may be one selected from the group consisting of compounds represented in the following Compound Group 1. However, an embodiment of the inventive concept is not limited thereto.

[Compound Group 1]

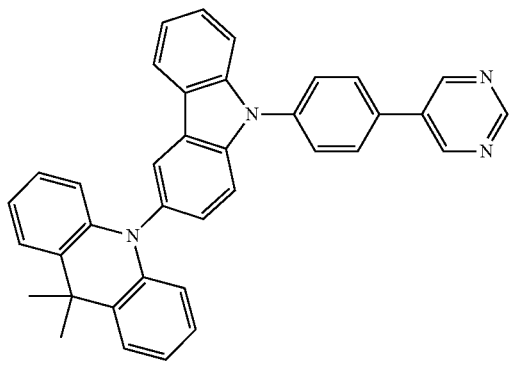

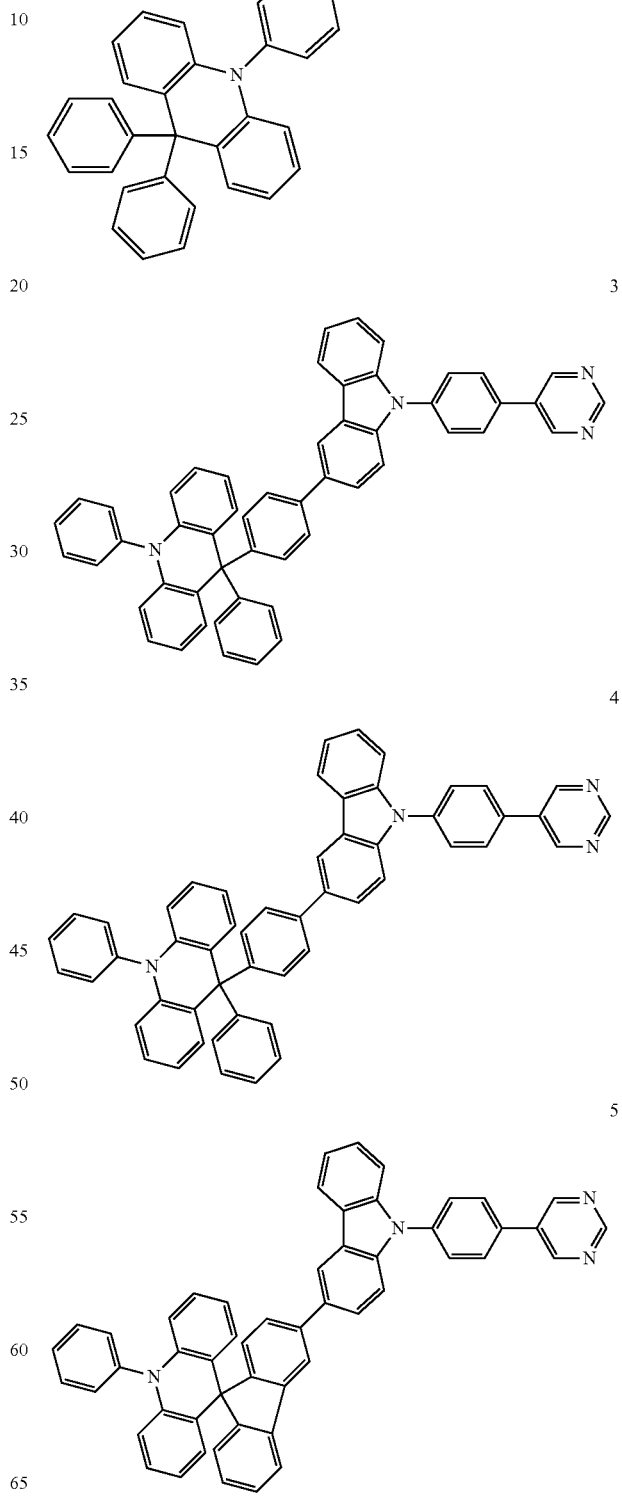

6
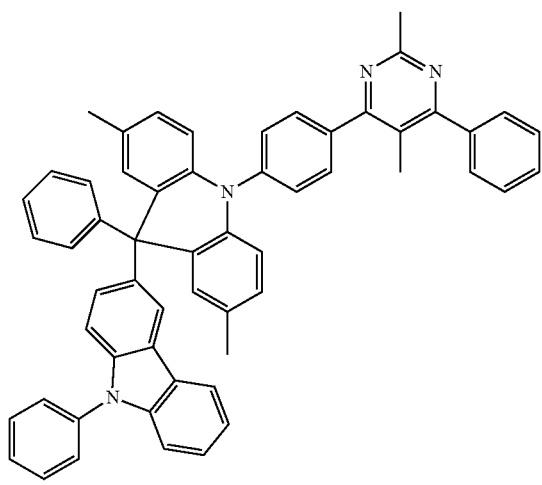
7
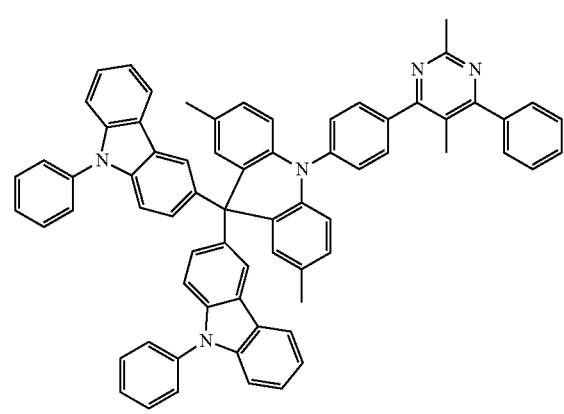
8
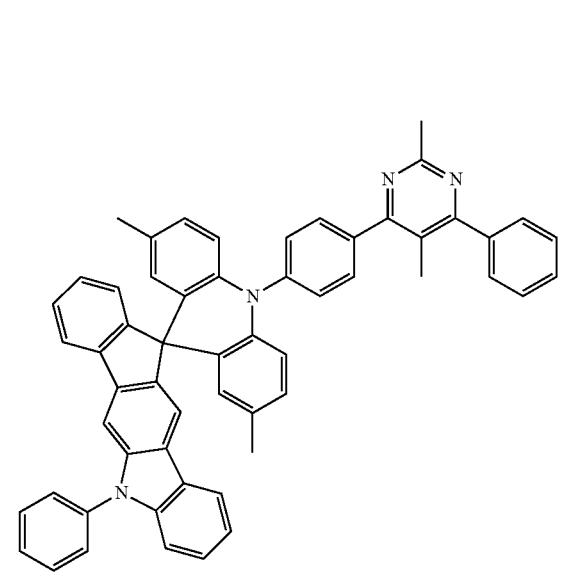
9
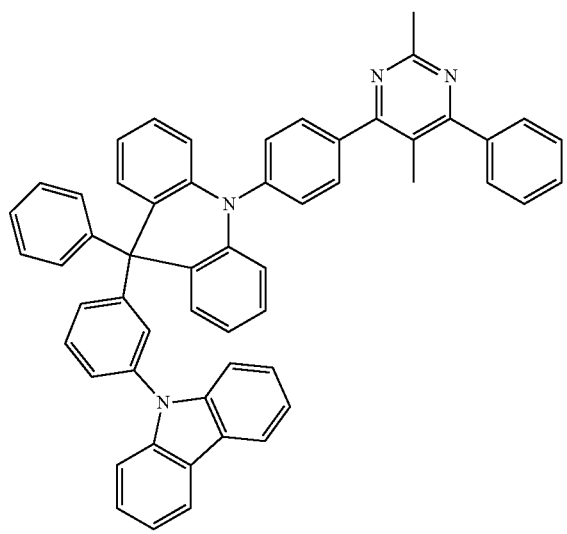
10
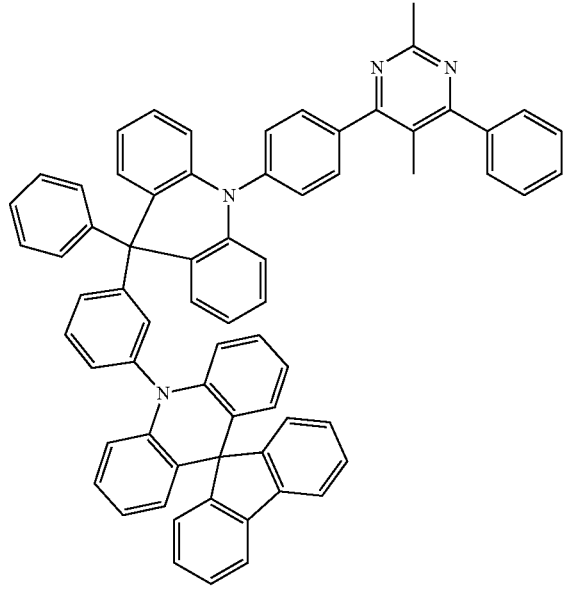
11
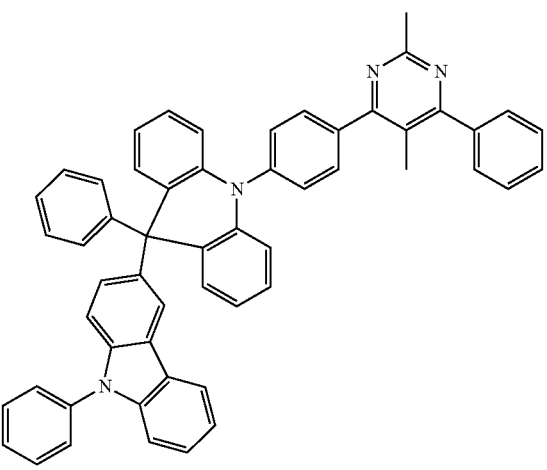

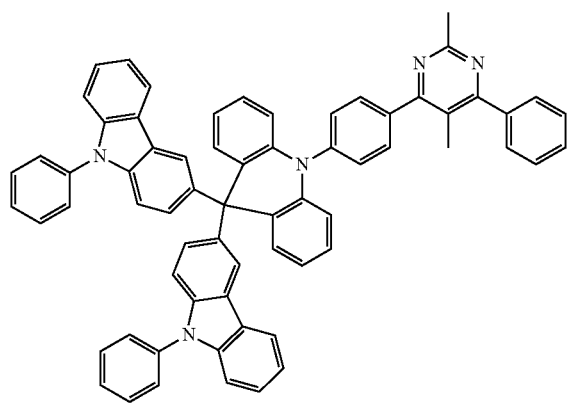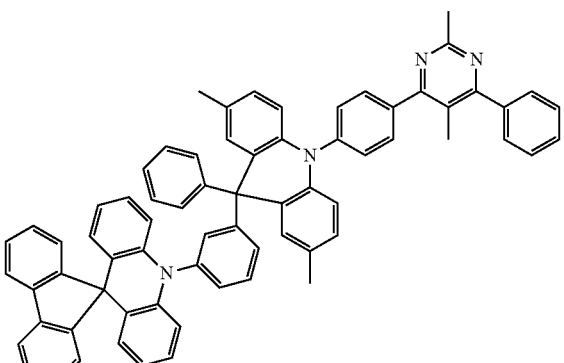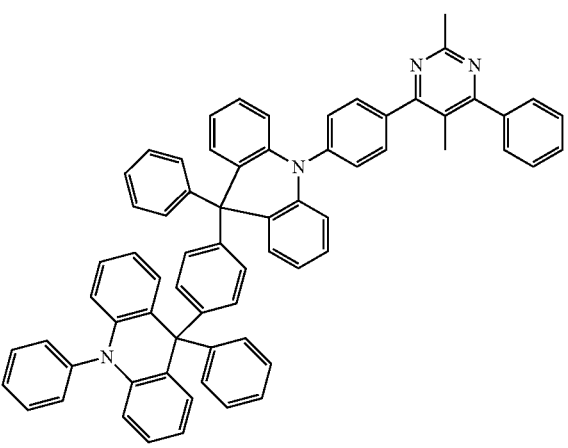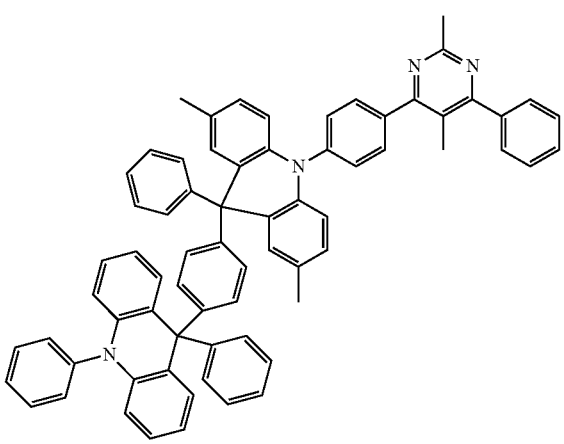

-continued
18
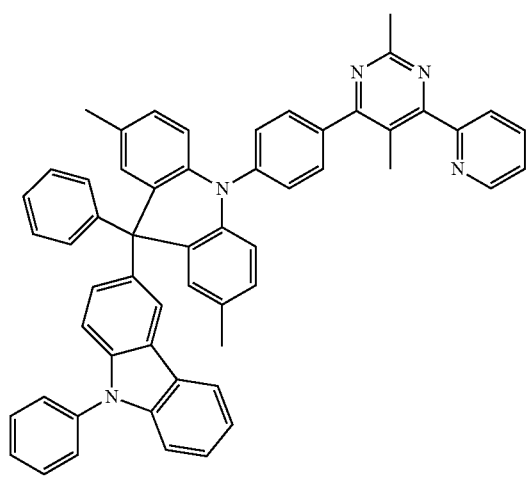
19
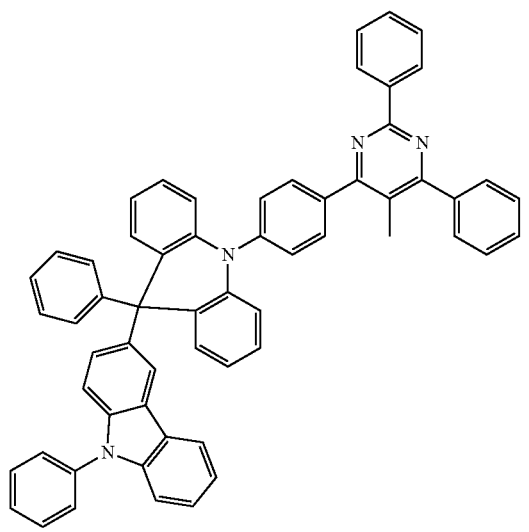
20
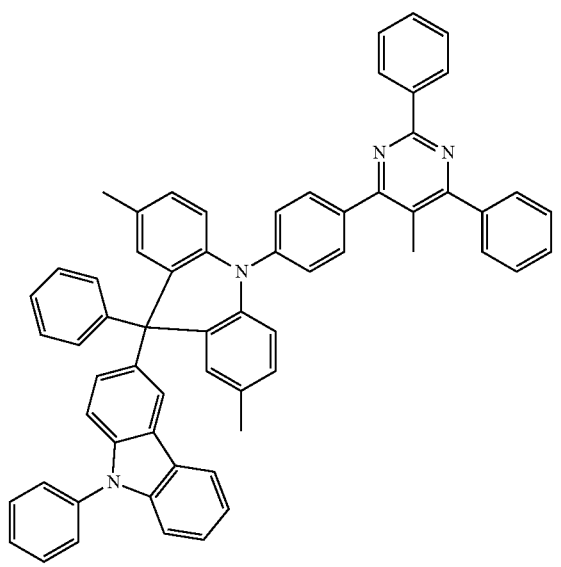
-continued
21
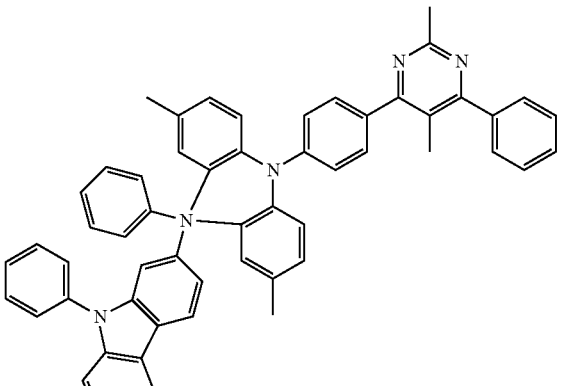
22
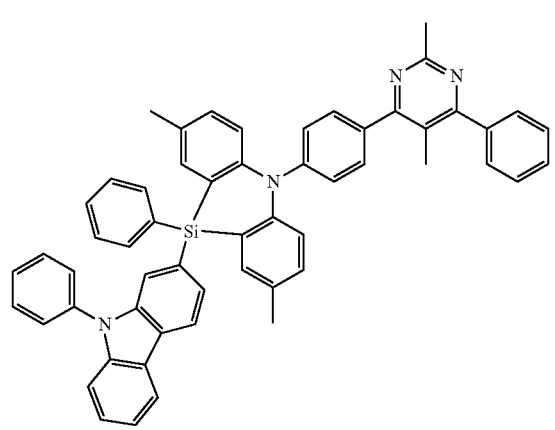
23
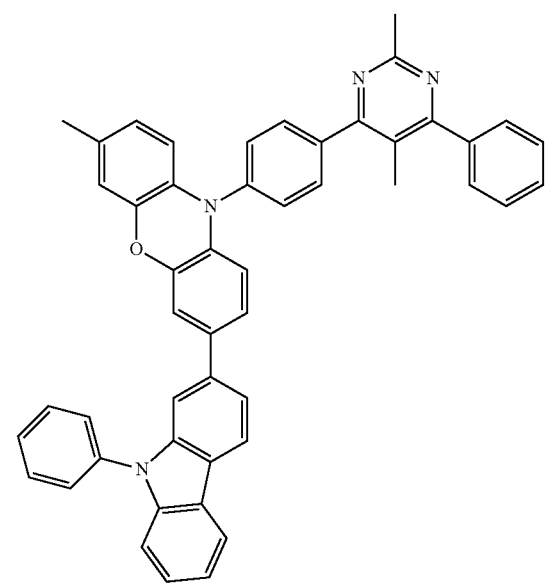

24

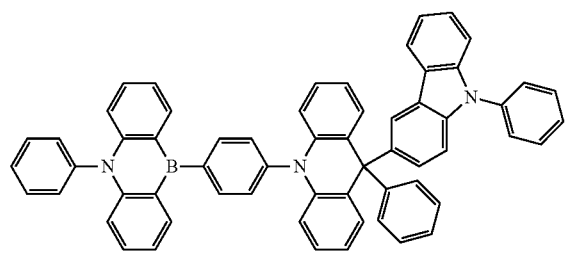

25

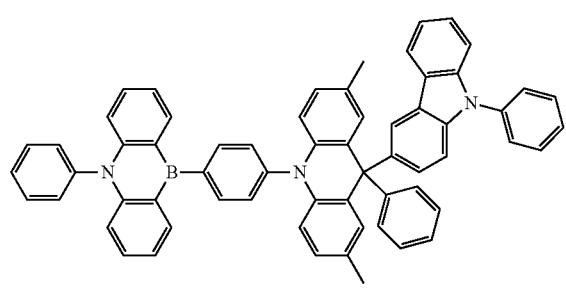

26

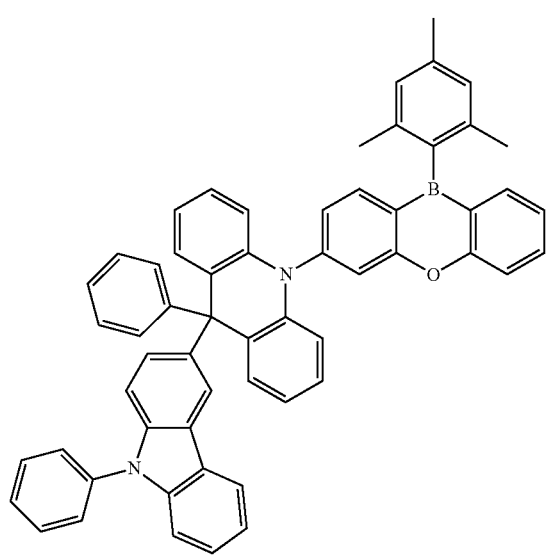

27

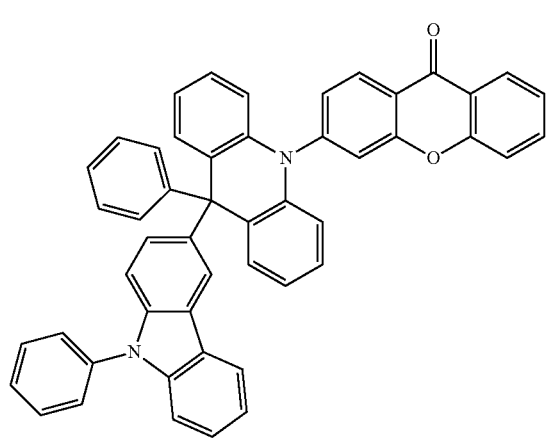

When the aromatic compound according to an embodiment of the inventive concept is applied to an organic electroluminescence device, emission efficiency of the organic electroluminescence device may be improved. The aromatic compound according to an embodiment of the inventive concept may be used as a luminescence material for thermally activated delayed fluorescence emitting blue light. The aromatic compound according to an embodiment of the inventive concept may be used in an organic electroluminescence device to attain deep blue light, and have high emission efficiency in blue light emitting region.

Especially, the aromatic compound according to an embodiment of the inventive concept has a hole transport functional group in the following moiety, which corresponds to an electron donor, to enhance a hole transport property into an emission layer, thereby achieving a charge balance and improving emission efficiency of an organic electroluminescence. Furthermore, the aromatic compound according to an embodiment of the inventive concept has a hole transport functional group in the moiety corresponding to an electron donor to enhance a hole transport property, thereby expanding emission region and attaining the effect of decreased roll-off.

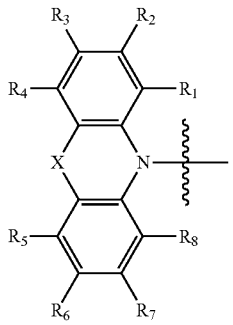

Hereinafter, an organic electroluminescence device according to an embodiment of the inventive step will be explained. The explanation will be mainly given with features different from the aromatic compound according to an embodiment of the inventive concept, and unexplained parts will follow the above-description on the aromatic compound according to an embodiment of the inventive concept.

Figure 2:
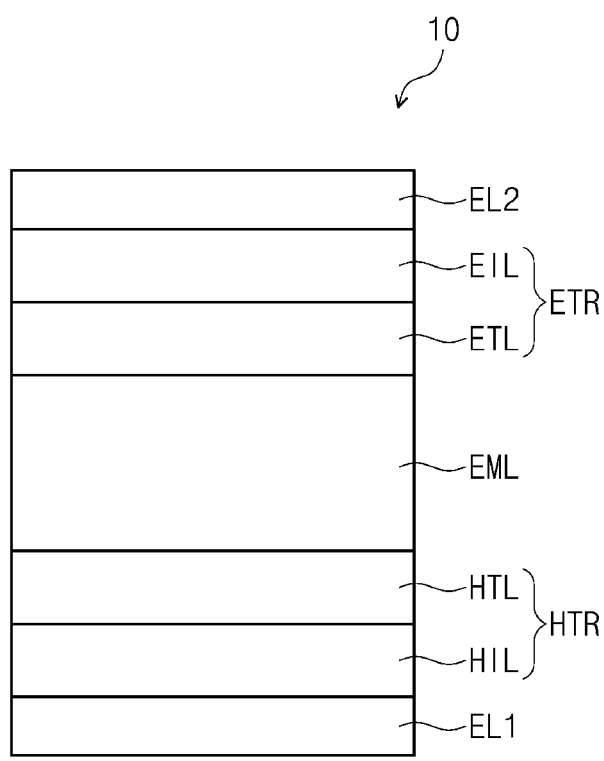
FIG. 2 is a schematic cross-sectional view of an organic electroluminescence device according to an embodiment of the inventive concept.

FIG. 1 is a schematic cross-sectional view illustrating an organic electroluminescence device according to an embodiment of the inventive concept. FIG. 2 is a schematic cross-sectional view illustrating an organic electroluminescence device according to an embodiment of the inventive concept.

Referring to FIGS. 1 and 2, an organic electroluminescence device 10 according to an embodiment of the inventive concept may include a first electrode EL1, a hole transport region HTR, an emission layer EML, an electron transport region ETR, and a second electrode EL2, laminated in order.

The first electrode EL1 and the second electrode EL2 are disposed on opposite sides of the device, with a plurality of organic layers disposed therebetween. The plurality of organic layers may include a hole transport region HTR, an emission layer EML and an electron transport region ETR.

The organic electroluminescence device according to an embodiment of the inventive concept may include the aromatic compound according to an embodiment of the inventive concept in an emission layer EML.

In the following description of an organic electroluminescence device 10, a case where the aromatic compound according to an embodiment of the inventive concept is included in an emission layer EML, will be explained. However, an embodiment of the inventive concept is not limited thereto. The aromatic compound according to an embodiment of the inventive concept may be included in at least one layer of a plurality of organic layers disposed between the first electrode EL1 and the second electrode EL2. For example, the aromatic compound according to an embodiment of the inventive concept may be included in a hole transport region HTR.

The first electrode EL1 has conductivity. The first electrode EL1 may be formed by a metal alloy or a conductive compound. The first electrode EL1 may be an anode.

The first electrode EL1 may be a transmissive electrode, a transflective electrode, or a reflective electrode. In case the first electrode EL1 is the transmissive electrode, the first electrode EL1 may be made of a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed using the above materials, and a transparent conductive layer formed using ITO, IZO, ZnO, or ITZO.

The hole transport region HTR is disposed on the first electrode EL1. The hole transport region HTR may include at least one of a hole injection layer HIL, a hole transport layer HTL, a hole buffer layer, or an electron blocking layer. The thickness of the hole transport region HTR may be from about 1,000 Å to about 1,500 Å, for example.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, laminated in order from the first electrode EL1. However, an embodiment of the inventive concept is not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the hole transport region, HTR includes the hole injection layer HIL and the hole transport layer HTL, the hole injection layer HIL may include a known hole injection material.

The known hole injection material may include, for example, triphenylamine-containing polyether ketone (TPA-PEK), 4-isopropyl-4'-methyldiphenyliodiniumtetrakis(pentafluorophenyl)borate (PPBI), N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), 4,4',4"-tris(N,N-diphenylamino) triphenylamine (TDATA), 4,4',4"-tris{N-(2-naphthyl)-N-phenylamino}-triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), etc. However, an embodiment of the inventive concept is not limited thereto.

In case the hole transport region HTR includes the hole injection layer HIL and the hole transport layer HTL, the hole transport layer HTL may include a known hole injection material.

The known hole transport material may include, for example, 1,1-bis[(di-4-tolylamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N, N'-diphenylbenzidine (NPB), etc. However, an embodiment of the inventive concept is not limited thereto.

The thickness of the hole transport region HTR may be from about 100 Å to about 10,000 Å, for example, from about 100 Å to about 1,000 Å. In case the hole transport region HTR includes both of the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 30 Å to about 1,000 Å. In case the thicknesses of the hole transport region HTR, the hole injection layer HIL and the hole transport layer HTL satisfy the above-described ranges, satisfactory hole transport properties may be obtained without the substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide, without limitation.

As described above, the hole transport region HTR may further include at least one of the hole buffer layer or the electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR into the hole transport region HTR.

The emission layer EML is disposed on the hole transport region HTR. The thickness of the emission layer EML may be, for example, from about 100 Å to about 600 Å. The emission layer EML may have a single layer formed using a single material, a single layer formed using a plurality of different materials, or a multilayer structure having a plurality of layers formed using a plurality of different materials.

The emission layer EML may include the above-described aromatic compound according to an embodiment of the inventive concept. Particularly, the emission layer EML may include the aromatic compound represented by the following Formula 1.

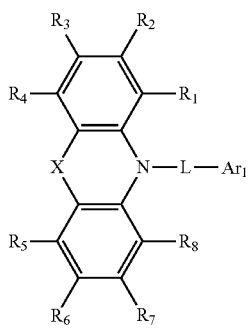

[Formula 1]

In Formula 1, $Ar_1$ is a substituted or unsubstituted heteroaryl group having 4 to 30 carbon atoms for forming a ring, L is a direct linkage, or a substituted or unsubstituted phenylene group, and X may be a direct linkage, O, S, $NR_a$, $CR_bR_e$, $SiR_dR_e$, $GeR_fR_g$, $P(=O)R_h$, or $P(=S)R_i$.

In Formula 1, each of $R_1$ to $R_8$ may independently be a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring.

In addition, each of $R_a$ to $R_i$ is independently a hydrogen atom, a deuterium atom, a halogen atom, a substituted or unsubstituted silyl group, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or may form a ring by combining adjacent groups with each other. Meanwhile, $R_d$ and $R_e$ are not both phenyl groups at the same time.

In Formula 1, the explanation on the aromatic compound according to an embodiment of the inventive concept may be applied to the particular explanation on $Ar_1$, L, and $R_1$ to $R_8$.

The emission layer EML may include one or more of the aromatic compound represented by Formula 1.

The emission layer EML may include at least one of the compounds represented by the following Formulae 1-1 to 1-10.

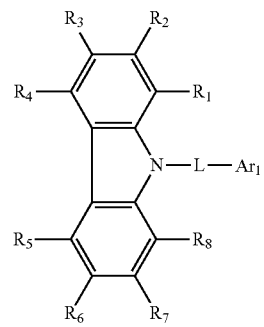

[Formula 1-1]

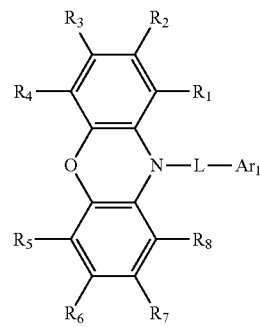

[Formula 1-2]

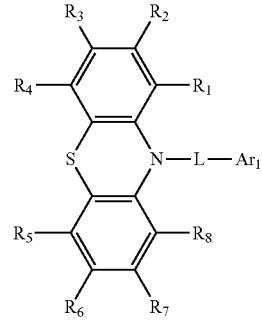

[Formula 1-3]

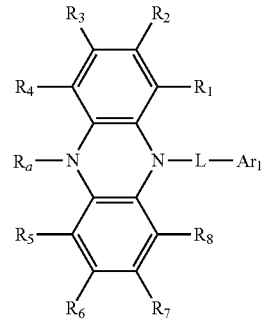

[Formula 1-4]

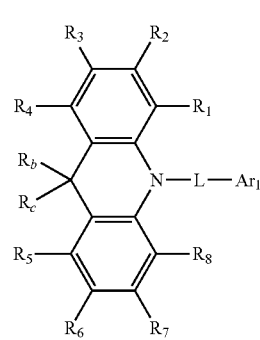

[Formula 1-5]

-continued

[Formula 1-6]
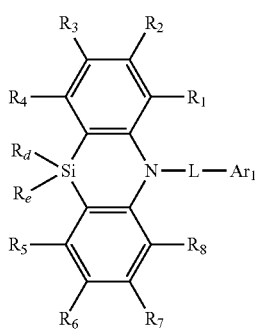

[Formula 1-7]
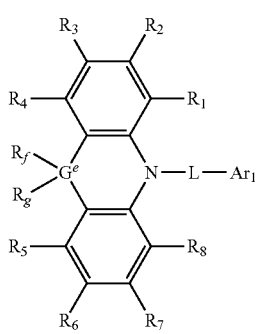

[Formula 1-8]
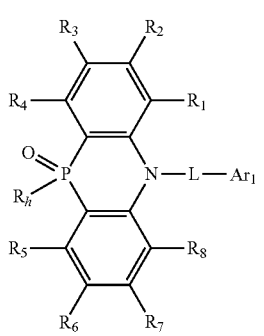

[Formula 1-9]
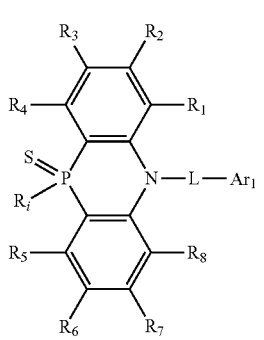

[Formula 1-10]
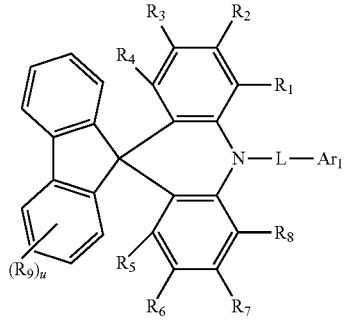

In Formula 1-10, $R_9$ is a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, or may form a ring by combining adjacent groups with each other. u may be an integer between 0 and 4, inclusive. When u is an integer of 2 or more, a plurality of $R_9$ may be the same or different from each other. The explanation on Formula 1 may be applied to $Ar_1$, L, $R_1$ to $R_8$, and $R_a$ to $R_i$.

The emission layer EML may include at least one of the aromatic compound represented by the following Formula 4 or 5.

[Formula 4]
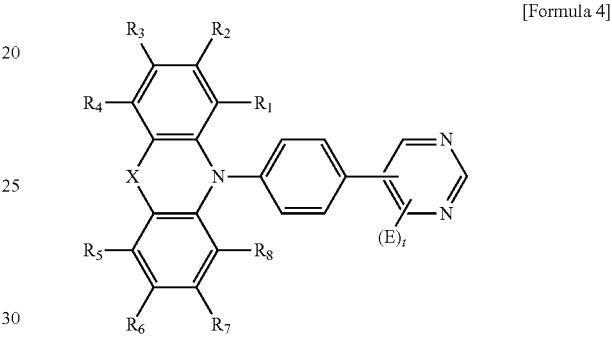

[Formula 5]
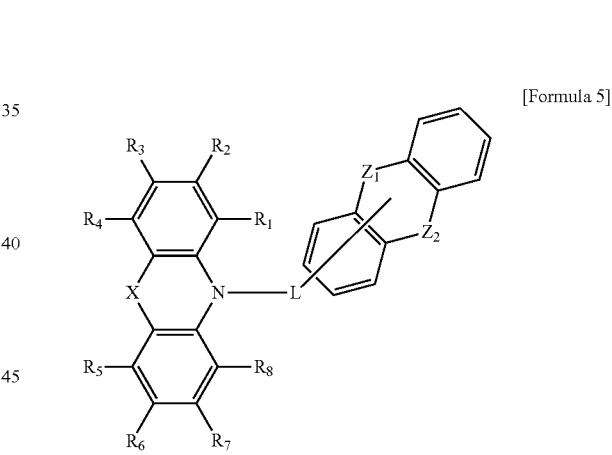

In Formula 4, E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, and t may be an integer between 0 and 3, inclusive.

In Formula 5, each of $Z_1$ and $Z_2$ may independently be BR', NR'', O, S, or C(=O), each of R' and R'' is independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring. In Formula 5, the explanation on Formula 1 may be applied to X, L and $R_1$ to $R_8$.

The emission layer EML may include at least one of the compounds represented in the following Compound Group 1.

[Compound Group 1]
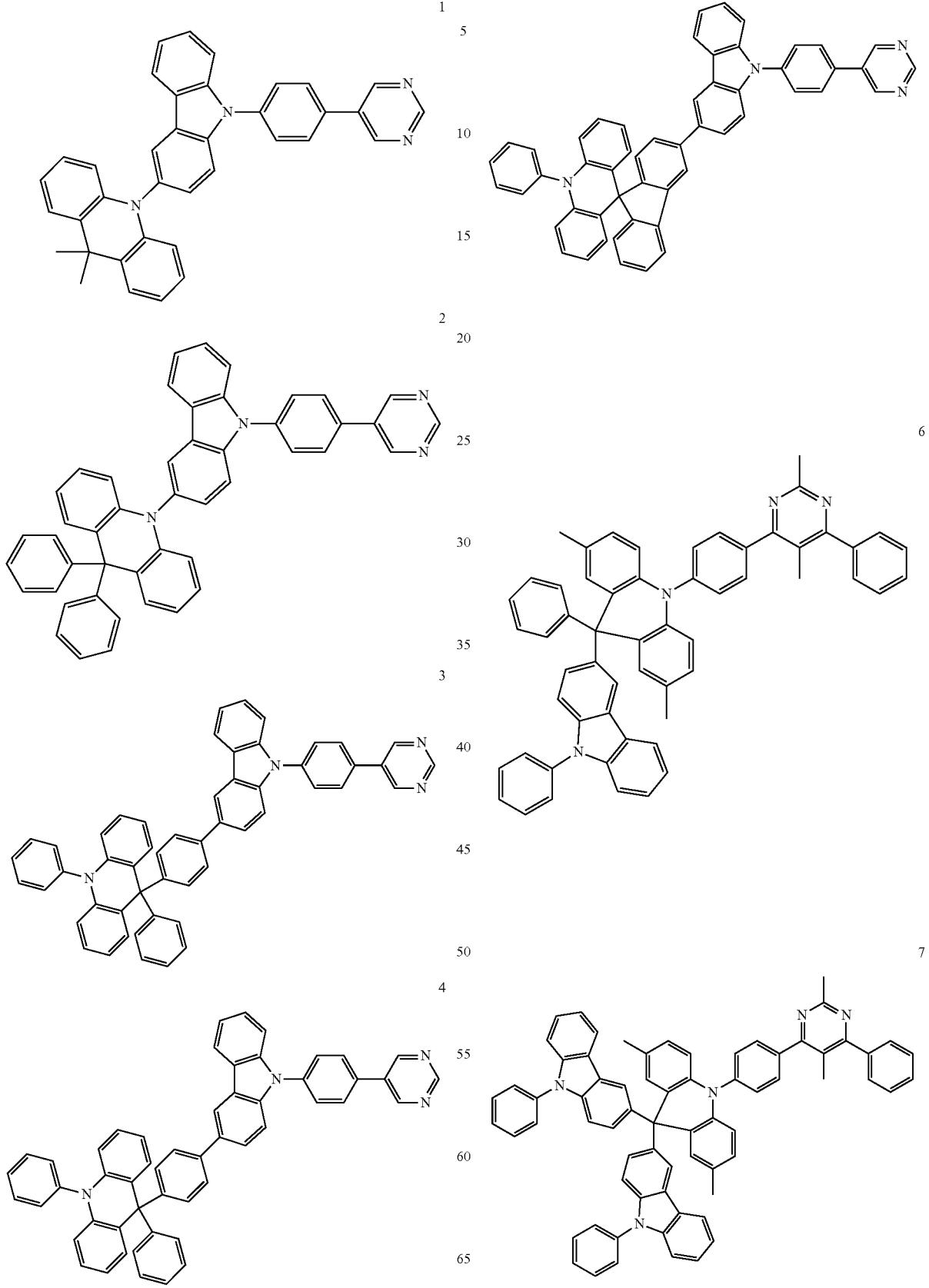

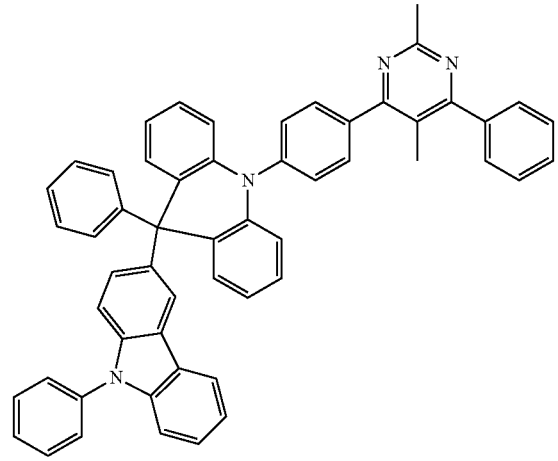
11
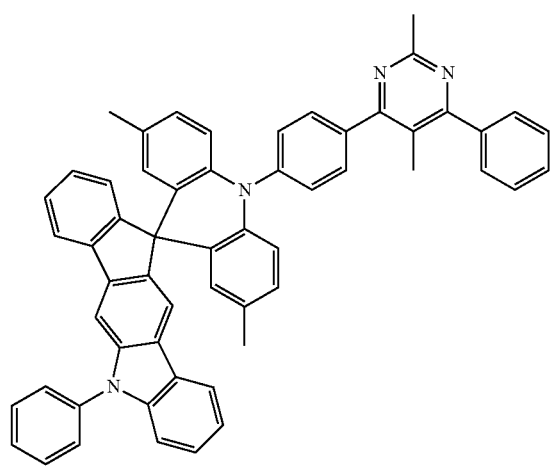
8
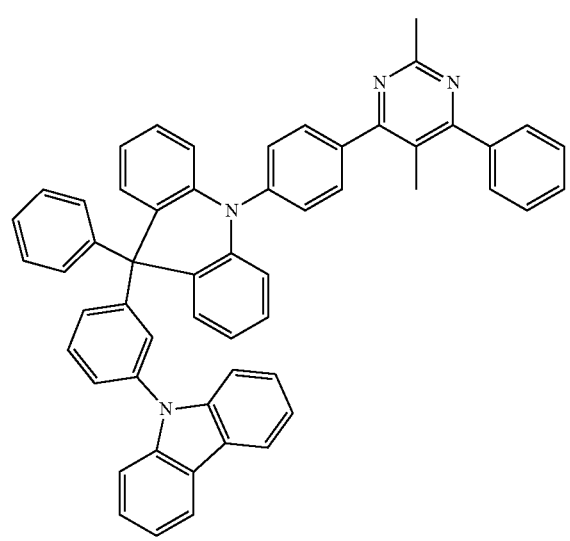
9
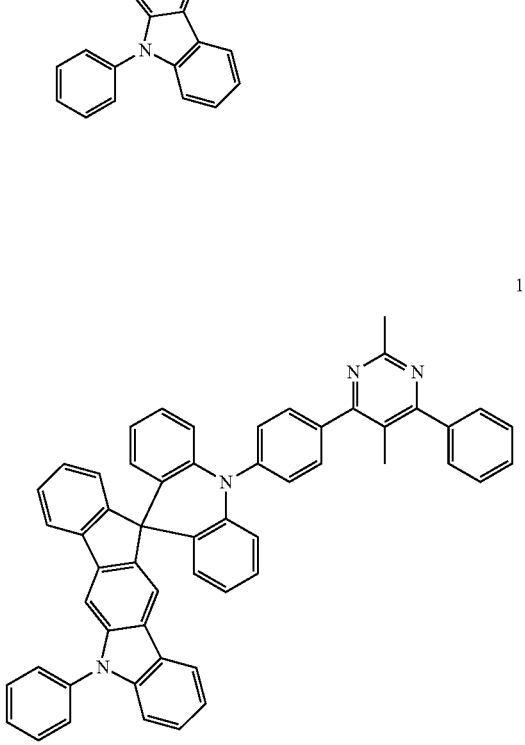
12
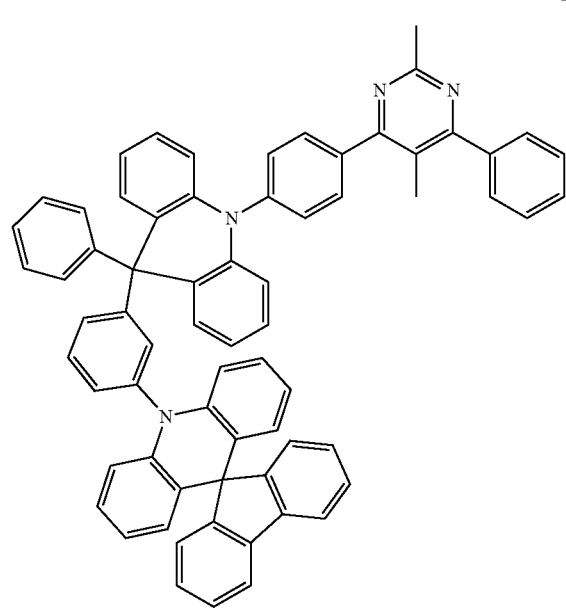
10
13

-continued
14
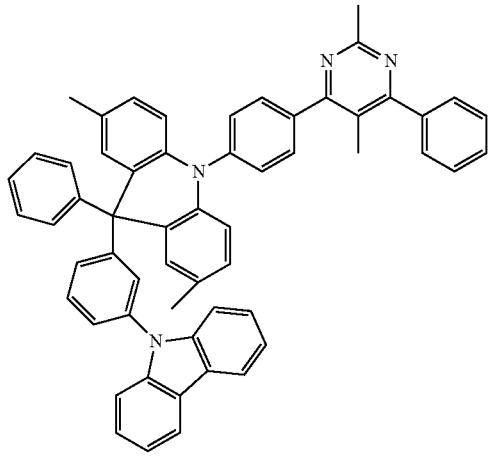
15
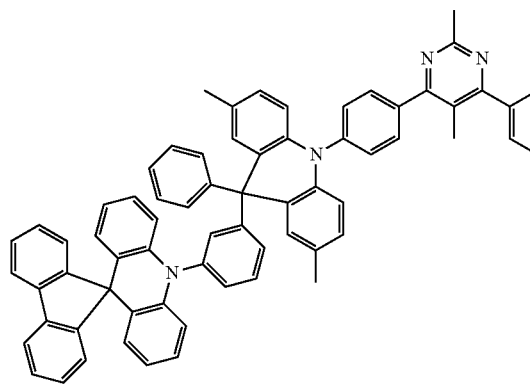
16
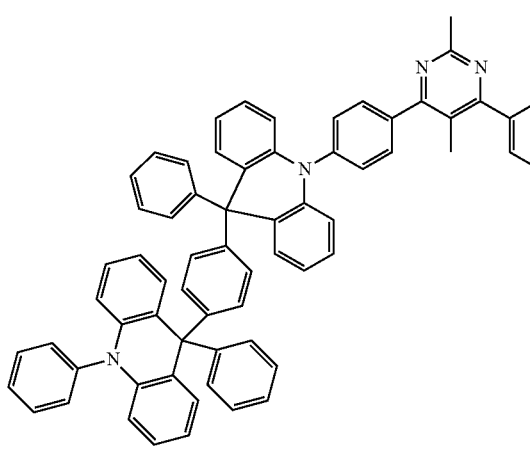
-continued
17
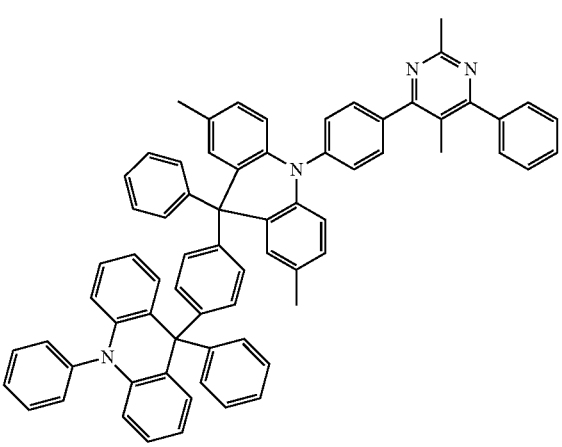
18
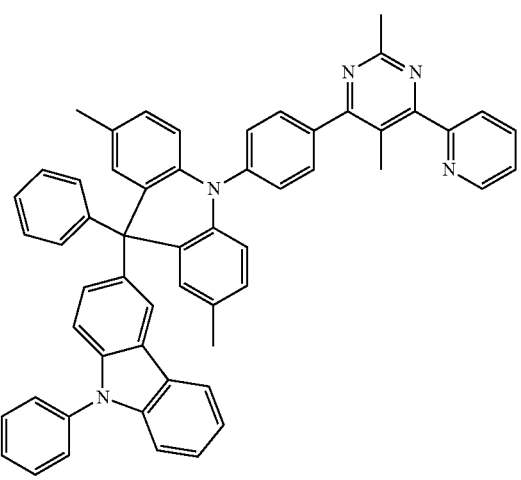
19
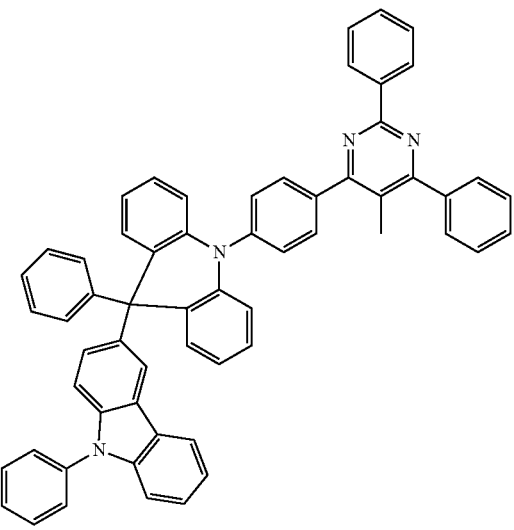

20
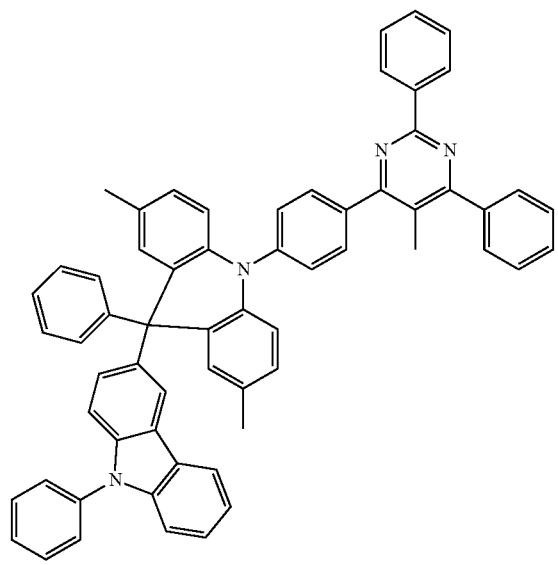
21
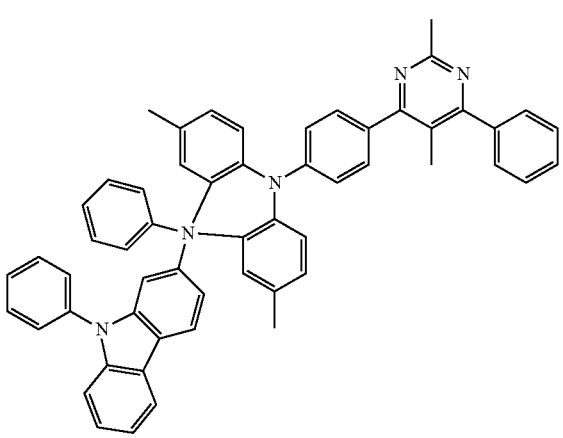
22
23
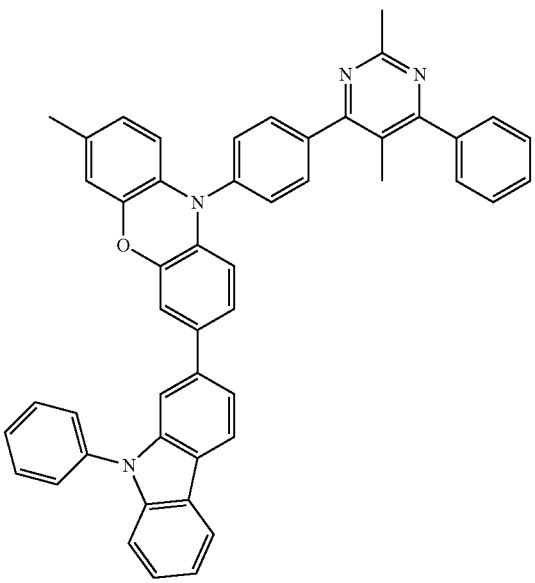
24
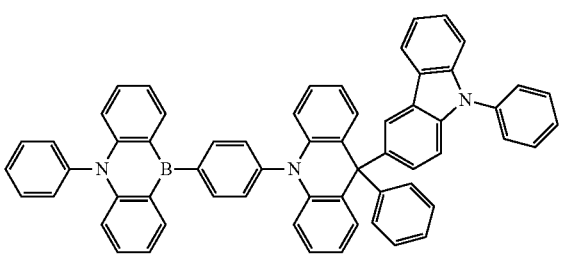
25
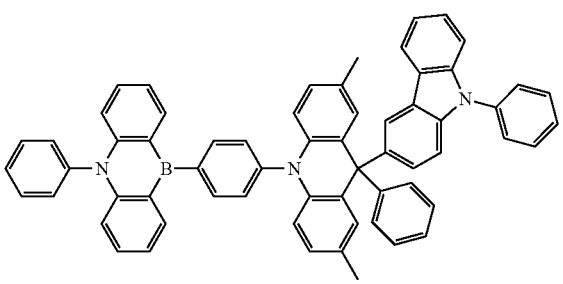

-continued

26

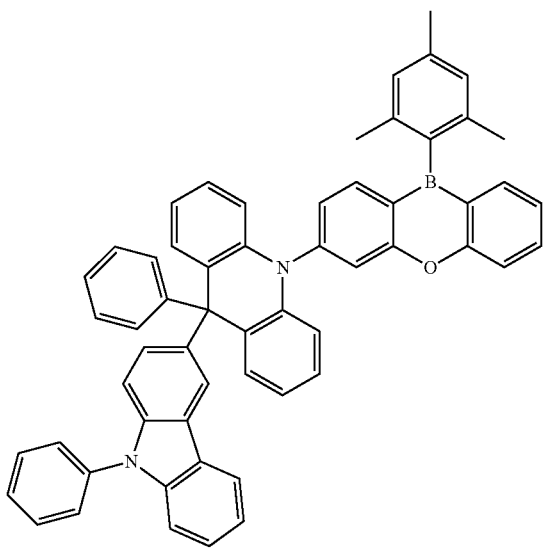

27

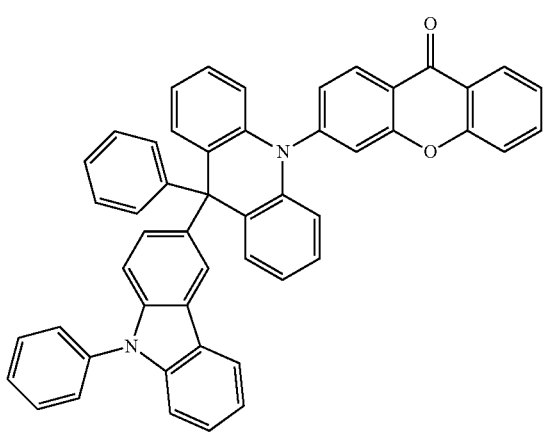

The emission layer EML may include further a known material in addition to the above-described aromatic compound according to an embodiment of the inventive concept. For example, the emission layer EML may include a fluorescent material including any one selected from the group consisting of spiro-DPVBi, 2,2',7,7'-tetrakis(biphenyl-4-yl)-9,9'-spirobifluorene(spiro-sexiphenyl) (spiro-6P), distyrylbenzene (DSB), distyryl-arylene (DSA), polyfluorene (PFO)-based polymer and poly(p-phenylene vinylene) (PPV)-based polymer, as a known material. However, an embodiment of the inventive concept is not limited thereto.

The aromatic compound according to an embodiment of the inventive concept may be included in the emission layer EML to emit delayed fluorescence. That is, the aromatic compound according to an embodiment of the inventive concept is a delayed fluorescence material. The aromatic compound represented by Formula 1 according to an embodiment of the inventive concept is a thermally activated delayed fluorescence (TADF) material.

The aromatic compound according to an embodiment of the inventive concept may include an electron acceptor, a linker and an electron donor to emit delayed fluorescence. Specifically, in the aromatic compound represented by Formula 1, $Ar_1$ may be an electron acceptor, L may be a linker, and the following moiety may be an electron donor.

$$\begin{array}{c} R_3 \quad R_2 \\ R_4 \underset{\phantom{X}}{\overset{\phantom{X}}{\diagup}} R_1 \\ X \underset{\phantom{N}}{\phantom{X}} N \underset{\phantom{X}}{\sim} \\ R_5 \underset{\phantom{X}}{\overset{\phantom{X}}{\diagup}} R_8 \\ R_6 \quad R_7 \end{array}$$

The organic electroluminescence device according to an embodiment of the inventive concept may include the aromatic compound represented by Formula 1 according to an embodiment of the inventive concept in an emission layer to improve emission efficiency. The organic electroluminescence device according to an embodiment of the inventive concept including the aromatic compound according to an embodiment of the inventive concept may emit deep blue light. In addition, the aromatic compound according to an embodiment of the inventive concept may have the energy gap between the singlet energy level and the triplet energy level adjusted to about 0.2 eV or less, thereby enabling the organic electroluminescence device according to an embodiment of the inventive concept to emit efficiently a thermally activated delayed fluorescence.

The aromatic compound according to an embodiment of the inventive concept may be a thermally activated delayed fluorescence material emitting blue light. Accordingly, the emission layer EML of the organic electroluminescence device 10 including the aromatic compound according to an embodiment of the inventive concept may emit blue light. The emission layer EML of the organic electroluminescence device 10 according to an embodiment of the inventive concept may emit deep blue light. The emission layer EML of the organic electroluminescence device 10 according to an embodiment of the inventive concept including the aromatic compound according to an embodiment of the inventive concept may emit blue light having a wavelength range of about 440 nm to about 480 nm, about 440 nm to about 475 nm, about 440 nm to about 470 nm, or about 440 nm to about 450 nm.

The aromatic compound according to an embodiment of the inventive concept may be included in the emission layer EML as a dopant material.

The emission layer EML may further include a host. The host may be any material commonly used without specific limitation and may include, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc.

The aromatic compound according to an embodiment of the inventive concept may have an absolute value of the difference between the singlet energy level and the triplet energy level of about 0.2 eV or less. By including the aromatic compound according to an embodiment of the inventive concept having a little energy gap between the singlet energy level and the triplet energy level in the emission layer EML, the organic electroluminescence device 10 according to an embodiment of the inventive concept may efficiently emit a thermally activated delayed fluorescence, thereby improving emission efficiency.

The electron transport region ETR is provided on the emission layer EML. The electron transport region ETR may include at least one of a hole blocking layer, an electron transport layer ETL or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. In addition, the electron transport region ETR may have a single layer structure having a plurality of different materials, or a laminated structure of electron transport layer ETL/electron injection layer EIL, or hole blocking layer/electron transport layer ETL/electron injection layer EIL, laminated in order from the emission layer EML, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the electron transport region ETR includes the electron transport layer ETL, the electron transport region ETR may include a known material. For example, the electron transport region ETR may include tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate) (Bebq$_2$), 9,10-di(naphthalene-2-yl)anthracene (ADN), or a mixture thereof, without limitation.

When the electron transport region ETR includes the electron transport layer ETL, the thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

In case the electron transport region ETR includes the electron injection layer EIL, the electron transport region ETR may include a known material. For example, the electron transport region ETR may use LiF, lithium quinolate (LiQ), Li$_2$O, BaO, NaCl, CsF, a metal in lanthanoids such as Yb, or metal halides such as RbCl and RbI, without limitation. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate.

When the electron transport region ETR includes the electron injection layer EIL, the thickness of the electron injection layer EIL may be from about 1 Å to about 100 Å, for example, from about 3 Å to about 90 Å. In case the thickness of the electron injection layer EIL satisfies the above described range, satisfactory electron injection properties may be obtained without inducing the substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen), without limitation.

The second electrode EL2 is disposed on the electron transport region ETR. The second electrode EL2 has conductivity. The second electrode EL2 may be formed by a metal alloy or a conductive compound. The second electrode EL2 may be a cathode. The second electrode EL2 may be a transmissive electrode, a transflective electrode or a reflective electrode. In case the second electrode EL2 is the transmissive electrode, the second electrode EL2 may be formed using transparent metal oxides, for example, ITO, IZO, ZnO, ITZO, etc.

In case the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Even not shown, the second electrode EL2 may be connected with an auxiliary electrode. In case the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

In case the organic electroluminescence device 10 is a top emission type, the first electrode EL1 may be a reflective electrode, and the second electrode EL2 may be a transmissive electrode or a transflective electrode. In case the organic electroluminescence device 10 is a bottom emission type, the first electrode EL1 may be a transmissive electrode or a transflective electrode, and the second electrode EL2 may be a reflective electrode.

The organic electroluminescence device according to an embodiment of the inventive concept includes the aromatic compound according to an embodiment of the inventive concept, thereby securing improved emission efficiency. In addition, the organic electroluminescence device according to an embodiment of the inventive concept includes the above-described aromatic compound in the emission layer, thereby enabling the aromatic compound to emit light by the process of thermally activated delayed fluorescence and securing high efficiency. More specifically, the organic electroluminescence device according to an embodiment of the inventive concept includes the aromatic compound according to an embodiment of the inventive concept in the emission layer, thereby attaining a high efficiency blue light emitting device by the process of thermally activated delayed fluorescence.

Hereinafter, the aromatic compound according to an embodiment of the inventive concept and the organic electroluminescence device including the aromatic compound according to an embodiment of the inventive concept will be explained in more detail with reference to embodiments and comparative embodiments. The following embodiments are illustrated only for assisting the understanding of the inventive concept, and the scope of the inventive concept is not limited thereto.

EXAMPLES

1. Synthesis of Aromatic Compound

The synthetic method of the aromatic compounds according to an embodiment of the inventive concept will be specifically explained by using the synthesis of Compounds 16 and 21 to 23 in Compound Group 1 as an example. However, the synthetic method of the aromatic compounds described below is an example, and the synthetic method of the aromatic compounds according to an embodiment of the inventive concept is not limited thereto.

(Synthesis of Compound 21)

Compound 21, the aromatic compound according to an embodiment of the inventive concept, may be synthesized, for example, by the following reaction.

[Reraction scheme 1]

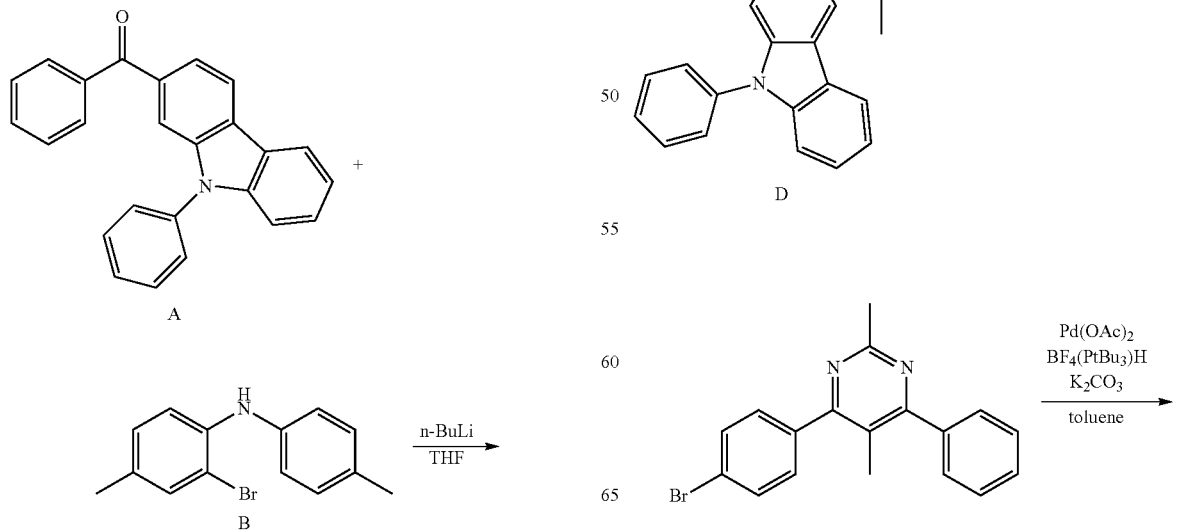

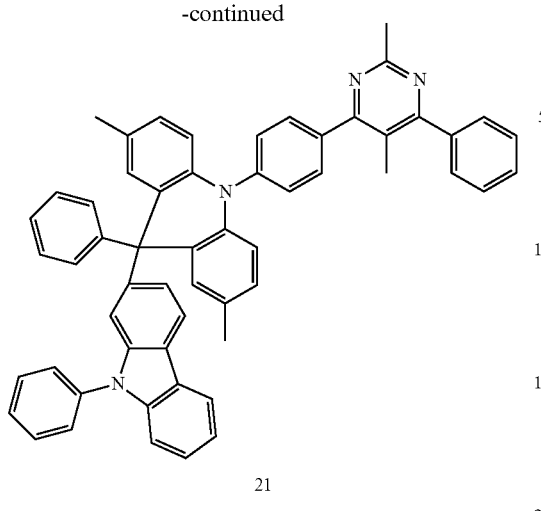

21

[Reaction scheme 2]

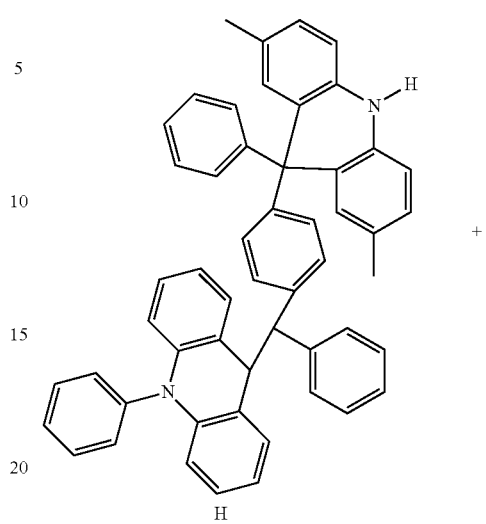

H

+

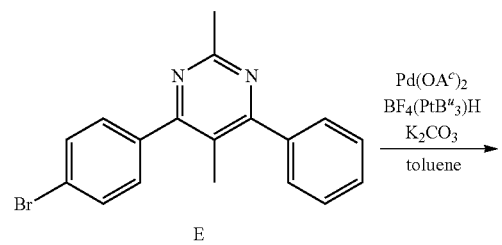

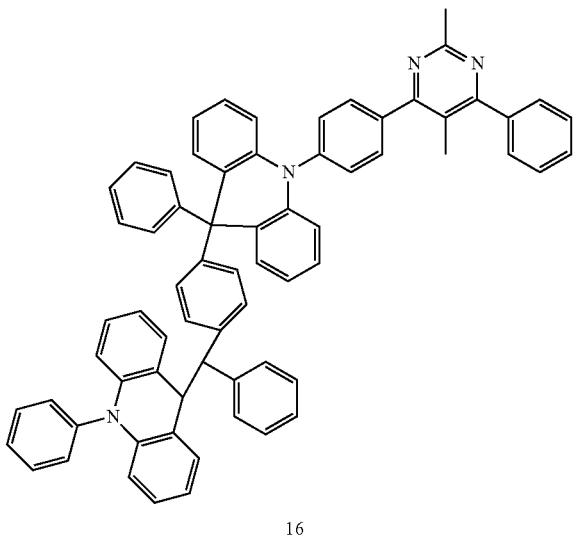

16

Under an argon (Ar) atmosphere, 8 g of Compound B and 100 mL of THF were injected to a 300 mL three neck flask and the mixture was cooled to about −78° C. 39.5 mL of n-BuLi was added thereto and the mixture was stirred for about 1 hour. Under an argon atmosphere, 10 g of Compound A dissolved in 100 mL of THF was added to the solution of Compound B dropwise and the resultant solution was stirred at room temperature for about 5 hours. After water was added thereto, an organic layer was separated and solvents were evaporated.

The crude product thus obtained was purified by silica gel column chromatography (using a mixture of dichloromethane and hexane) and then recrystallized with a mixture of toluene/hexane to obtain 2.77 g (yield 82%) of Compound C as a white solid.

Compound C was dissolved in 100 mL of toluene, MeSO$_3$H and polyphosphonic acid were added thereto, and the mixture was heated to reflux for about 3 hours. After cooling in the air, water was added thereto, an organic layer was separated and solvents were evaporated. The crude product thus obtained was purified by silica gel column chromatography (using a mixture of dichloromethane and hexane) and then recrystallized with a mixture of toluene/hexane to obtain 5.97 g (yield 94%) of Compound D as a white solid.

5 g of Compound D, 3.5 g of Compound E, 0.1 g of palladium acetate, 0.25 g of PH(tBu)$_3$/BF$_4$ and 1.77 g of potassium carbonate were added to 50 mL of toluene and the resultant was heated to reflux for about 6 hours. After cooling in the air, water was added thereto, an organic layer was separated and solvents were evaporated. The crude product thus obtained was purified by silica gel column chromatography (using a mixture of dichloromethane and hexane) and then recrystallized with a mixture of toluene/hexane to obtain 6.1 g (yield 80%) of Compound 21 as a white solid (Synthesis of Compound 16)

Compound 16, the aromatic compound according to an embodiment of the inventive concept, may be synthesized, for example, by the following reaction.

Compound 16 was synthesized by conducting the same synthetic method of Compound 21 except for using Compound H instead of Compound D in the synthetic method of Compound 21 (yield 70%).

(Synthesis of Compound 22)

Compound 22, the aromatic compound according to an embodiment of the inventive concept, may be synthesized, for example, by the following reaction.

[Reaction scheme 3]

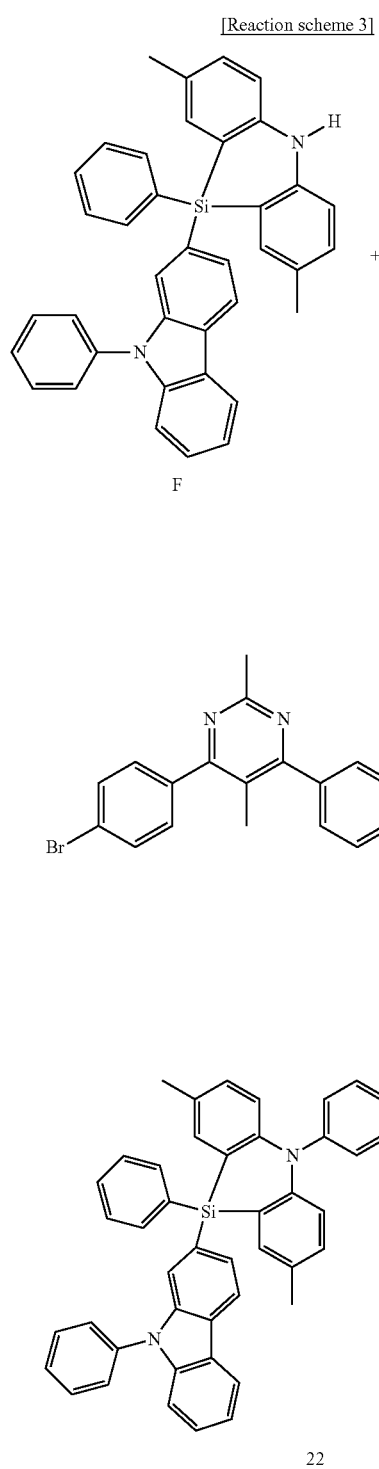

Compound 22 was synthesized by conducting the same synthetic method of Compound 21 except for using Compound F instead of Compound D in the synthetic method of Compound 21 (yield 75%).

(Synthesis of Compound 23)

Compound 23, the aromatic compound according to an embodiment of the inventive concept, may be synthesized, for example, by the following reaction.

[Reaction scheme 4]

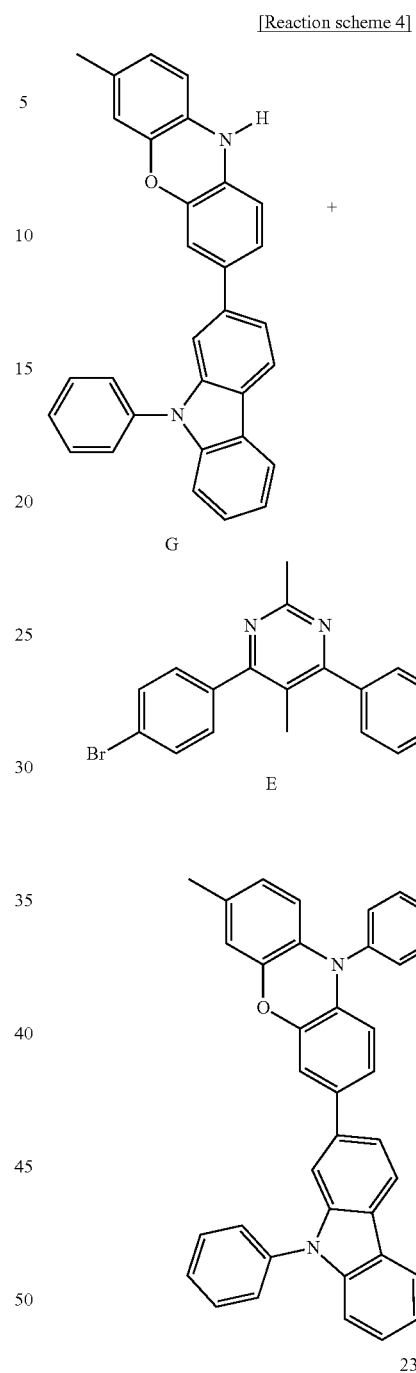

Compound 23 was synthesized by conducting the same synthetic method of Compound 21 except for using Compound G instead of Compound D in the synthetic method of Compound 21 (yield 78%).

2. Manufacturing of Organic Electroluminescence Devices Including Aromatic Compounds and Evaluation Thereof (Manufacturing of Organic Electroluminescence Devices)

Organic electroluminescence devices according to an embodiment of the inventive concept including the aromatic compounds according to an embodiment of the inventive concept were manufactured by the following method. Organic electroluminescence devices of Examples 1 to 4 were manufactured by using the above Compounds 16 and 21 to 23 as emission layer materials. Organic electroluminescent devices of Comparative Examples 1 and 2 were manufactured by using the following Comparative Compounds C1 and C2 as emission layer materials.
The compounds used for forming emission layers in Examples 1 to 4 and Comparative Examples 1 and 2 are shown in Table 1.
TABLE 1
Compound 16
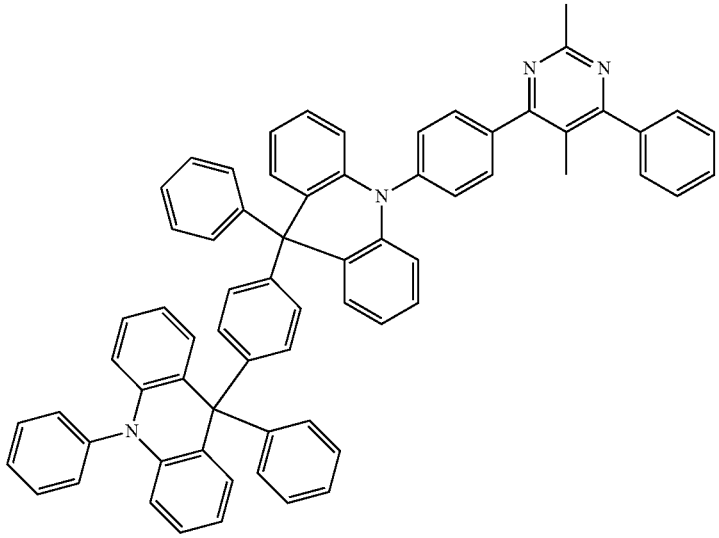
16
Compound 21
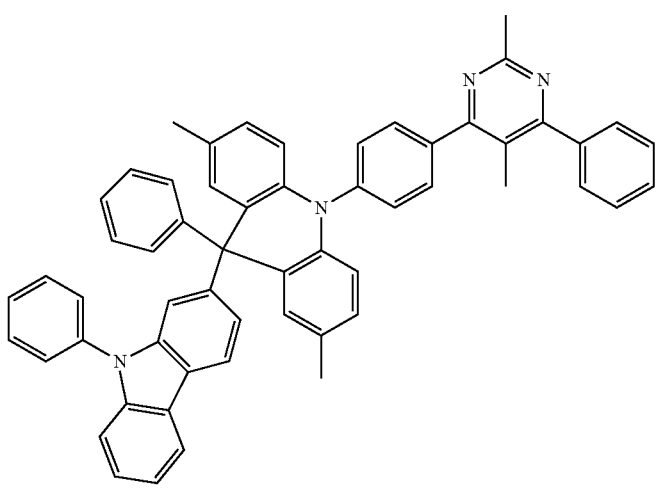
21

TABLE 1-continued
Compound 22
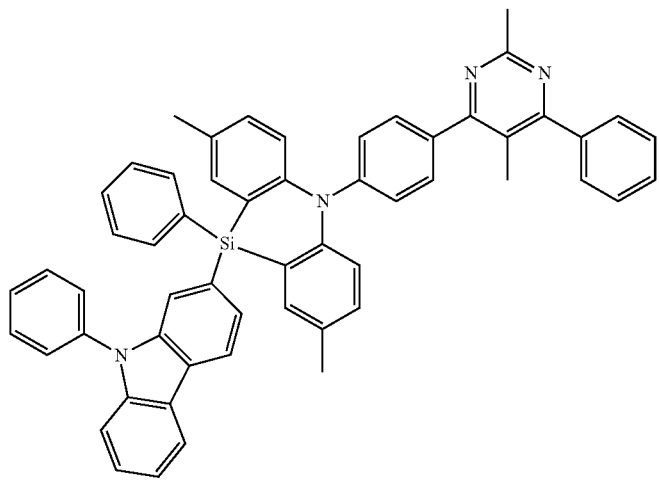
22
Compound 23
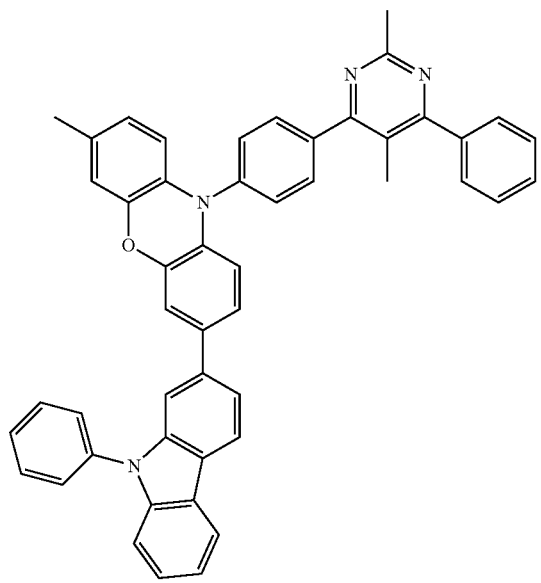
23
Comparative Compound C1
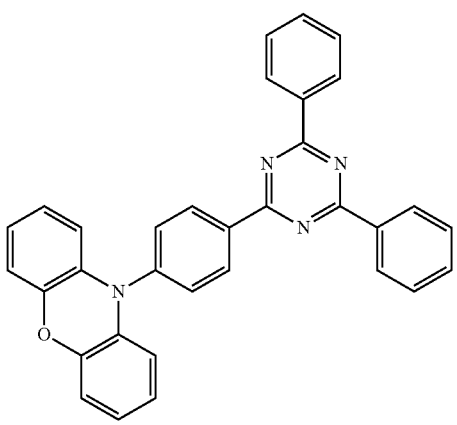
C1

TABLE 1-continued

Comparative Compound C2

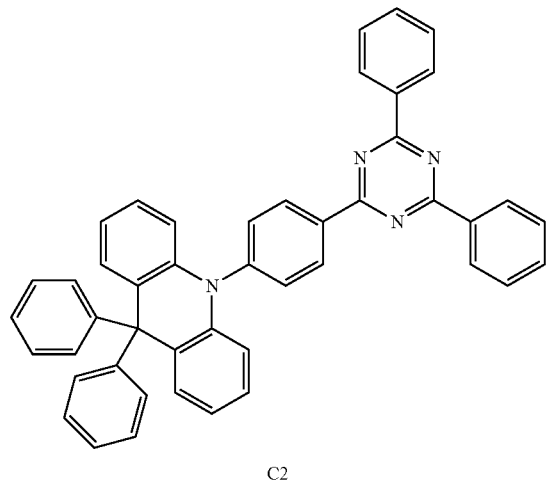 [SMILES: c1ccc(-c2nc(-c3ccccc3)nc(-c3ccc(N4c5ccccc5C(c5ccccc5)(c5ccccc5)c5ccccc54)cc3)n2)cc1 ; "C2"]

C2

The organic electroluminescence devices of Examples and Comparative Examples were manufactured by the following method.

ITO was patterned on a glass substrate to a thickness of about 1500 Å, followed by washing with ultrapure water and performing UV ozone treatment for about 10 minutes. After that, a hole injection layer was formed by using HAT-CN to a thickness of about 100 Å, and then a hole transport layer was formed by using NPB to a thickness of about 800 Å.

Next, in Examples, an emission layer was formed by co-deposition of each of the aromatic compounds (Compound 16 and 21 to 23) and DPEPO in the ratio of 18:92. The emission layer was formed to a thickness of about 200 Å. On the emission layer, an electron transport layer was formed using TPBi to a thickness of about 300 Å, and an electron injection layer was formed using LiF to a thickness of about 5 Å. A second electrode was formed using Al to a thickness of about 1000 Å.

In Examples the hole injection layer, hole transport layer, emission layer, electron transport layer, electron injection layer and second electrode were formed by a vacuum deposition method.

The organic electroluminescence devices of Comparative Examples 1 and 2 were manufactured by conducting the same manufacturing method of Examples except that emission layer was formed by co-deposition of Comparative Compound C1 or C2 and DPEPO in the ratio of 18:92.

(Property Evaluation of Organic Electroluminescence Devices)

The values of maximum light emitting wavelength ($l_{max}$), external quantum efficiency (EQE) and roll-off were measured to evaluate the properties of the organic electroluminescence devices manufactured in Examples and Comparative Examples. The absolute value ($\Delta E_{ST}$) of difference between singlet energy level and triplet energy level was also evaluated. The maximum light emitting wavelength of light emitting spectrum at ordinary temperature (about 300K) was measured by using the sample compounds to be deposited on quartz plate. The external quantum efficiency was measured by using an external quantum efficiency measurement system C9920-2-12 (Hamamatsu Photonics, Japan). Roll-off value was calculated by the following equation, in which EQE means external quantum efficiency at a current density of 10 mA/cm².

Roll-off=EQE(10 mA/cm²)/EQE(max)

$\Delta E_{ST}$, the difference between singlet energy level and triplet energy level, was calculated by functional B3LYP, 6-31G (d) using Gaussian09.

Property evaluation results of the organic electroluminescence devices are shown in Table 2 below.

TABLE 2

| Examples | Dopant of emission layer | $l_{max}$ (nm) | EQE (%) | Roll-off (%) | $\Delta E_{ST}$ |
|---|---|---|---|---|---|
| Example 1 | Compound 16 | 450 | 18.0 | 0.78 | 0.02 |
| Example 2 | Compound 21 | 455 | 19.5 | 0.75 | 0.01 |
| Example 3 | Compound 22 | 450 | 19.0 | 0.77 | 0.01 |
| Example 4 | Compound 23 | 460 | 17.5 | 0.79 | 0.01 |
| Comparative Example 1 | Comparative Compound C1 | 529 | 12.5 | 0.66 | 0.01 |
| Comparative Example 2 | Comparative Compound C2 | 475 | 14.0 | 0.54 | 0.01 |

The organic electroluminescence devices of Examples 1, 2, 3 and 4 include Compound 16, 21, 22 and 23, respectively, as a dopant of emission layer. The organic electroluminescence devices of Comparative Examples 1 and 2 include Comparative Compounds C1 and C2, respectively, as a dopant of emission layer.

Referring to the results in Table 2, it may be found that the organic electroluminescence devices of Examples 1 to 4 have emission efficiency higher than those of Comparative Examples 1 and 2. That is, it may be found that the organic electroluminescence devices of Examples 1 to 4 have external quantum efficiency higher than those of Comparative Examples 1 and 2. Furthermore, it may be found that the organic electroluminescence devices of Examples 1 to 4 show efficiency reduction caused by roll-off lower than those of Comparative Examples 1 and 2. That is, it may be represented that the higher the value of "roll-off" described in Table 2, the lower the emission efficiency reduction.

The organic electroluminescence devices of Examples 1 to 4 show higher efficiency in blue light emitting region and lower efficiency reduction caused by roll-off when compared with those of Comparative Examples 1 and 2. These results may be due to the dopant materials used in Examples containing a nitrogen atom with a hole transport property to adjust charge balance in emission device. Furthermore, it may be considered that extended light emitting region due to enhanced hole transport property results in decreased efficiency reduction caused by roll-off.

The organic electroluminescence device according to an embodiment of the inventive concept may attain high emission efficiency by including the aromatic compound according to an embodiment of the inventive concept. The aromatic compound according to an embodiment of the inventive concept may be used as a luminescence material for thermally activated delayed fluorescence emitting blue light to improve the blue light emission efficiency of organic electroluminescence device. Furthermore, the organic electroluminescence device according to an embodiment of the inventive concept may have the aromatic compound represented by Formula 1 with an appropriate substituent introduced thereto, thereby attaining blue light emitting as well as high external quantum efficiency.

The aromatic compound according to an embodiment of the inventive concept may improve emission efficiency of an organic electroluminescence device.

The organic electroluminescence device according to an embodiment of the inventive concept including the aromatic compound according to an embodiment of the inventive concept may attain high efficiency.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Thus, the scope of the inventive concept is to be determined by the broadest permissible interpretation of the following claims and their equivalents, and shall not be restricted or limited by the foregoing detailed description.

What is claimed is:

1. An organic electroluminescence device, comprising:
a first electrode;
a hole transport region disposed on the first electrode;
an emission layer disposed on the hole transport region;
an electron transport region disposed on the emission layer; and
a second electrode disposed on the electron transport region,
wherein the first electrode and the second electrode each independently comprise at least one selected from Ag, Mg, Cu, Al, Pt, Pd, Au, Ni, Nd, Ir, Cr, Li, Ca, Li/F/Ca, LiF/Al, Mo, Ti, In, Sn, and Zn, or an oxide thereof, or a compound thereof, or a mixture thereof:
wherein the emission layer comprises an aromatic compound represented by the following Formula 1:

[Formula 1]

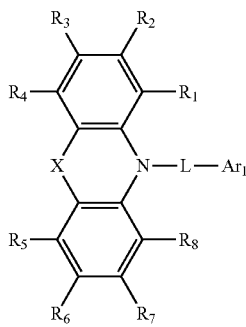

where $Ar_i$ is a substituted or unsubstituted heteroaryl group having 4 to 30 carbon atoms for forming a ring, L is a direct linkage, or a substituted or unsubstituted phenylene group, X is O, S, $NR_a$, $CR_bR_c$, $SiR_dR_e$, $GeR_fR_g$, $P(=O)R_h$, or $P(=S)R_i$, $R_1$ to $R_8$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, and $R_a$ to $R_i$ are each independently represented by one of Formulae 2-1 to 2-4:

[Formula 2-1]

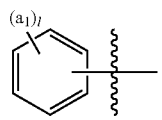

[Formula 2-2]

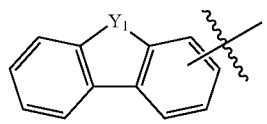

[Formula 2-3]

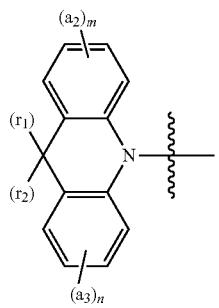

[Formula 2-4]

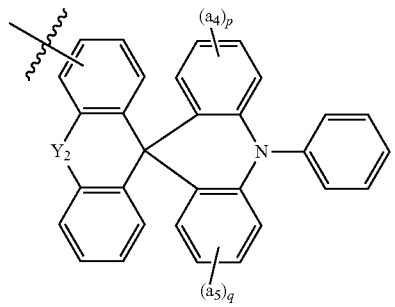

wherein in Formulae 2-1 to 2-4, $a_1$ to $a_5$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, $r_1$ and $r_2$ are each independently a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, l, m, n, p, and q are each independently an integer from 0 to 4, $Y_1$ is $NR_a$, O, or S, $Y_2$ is a direct linkage, O, or S, and $R_a$ is a hydrogen atom, a deuterium atom, a halogen atom, a substituted or unsubstituted silyl group, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other.

2. The organic electroluminescence device of claim 1, wherein the emission layer emits blue light.

3. The organic electroluminescence device of claim 1, wherein the aromatic compound represented by Formula 1 is a thermally activated delayed fluorescence compound.

4. The organic electroluminescence device of claim 1, wherein the aromatic compound represented by Formula 1 has an absolute value of the difference between the singlet energy level and the triplet energy level of 0.2 eV or less.

5. The organic electroluminescence device of claim 1, wherein Formula 1 is represented by one of the following Formulae 1-2 to 1-10:

[Formula 1-2]

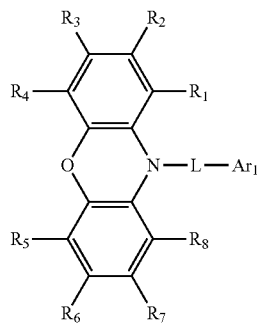

[Formula 1-3]

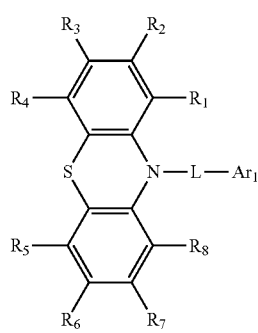

[Formula 1-4]

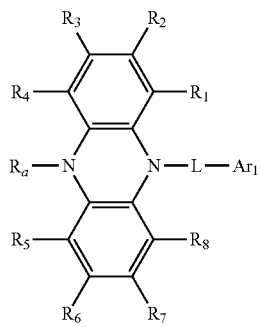

[Formula 1-5]

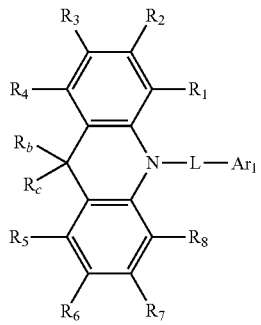

[Formula 1-6]

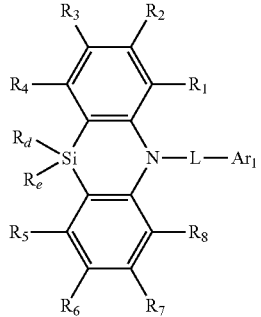

[Formula 1-7]

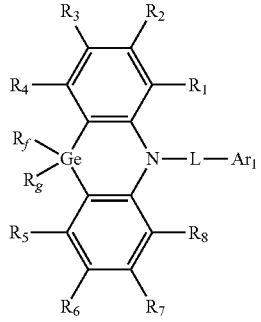

[Formula 1-8]

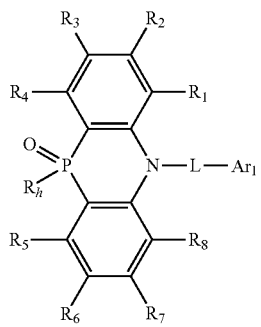

-continued

[Formula 1-9]

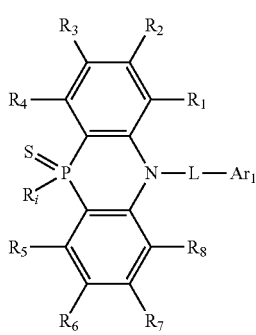

[Formula 1-10]

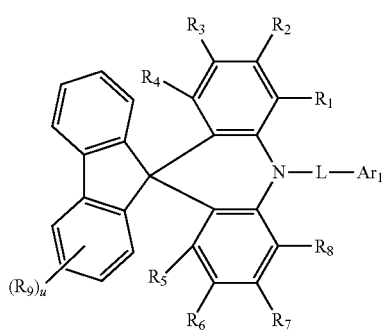

where $R_9$ is a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, or form a ring by combining adjacent groups with each other, u is an integer of 0 to 4, and $Ar_1$, L, $R_1$ to $R_8$, and $R_a$ to $R_i$ are the same as defined in Formula 1.

6. The organic electroluminescence device of claim 1, wherein $Ar_1$ is represented by the following Formula 3-1 or 3-2:

[Formula 3-1]

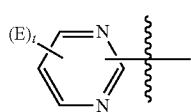

[Formula 3-2]

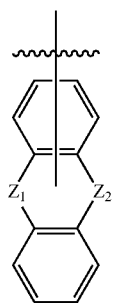

where E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, t is an integer of 0 to 3, $Z_1$ and $Z_2$ are each independently BR', NR", O, S, or C(=O), and R' and R" are each independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring.

7. The organic electroluminescence device of claim 1, wherein $R_a$ to $R_i$ are each independently represented by one of the following Formulae S1 to S18:

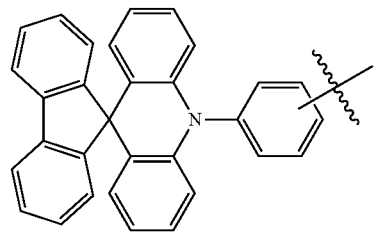

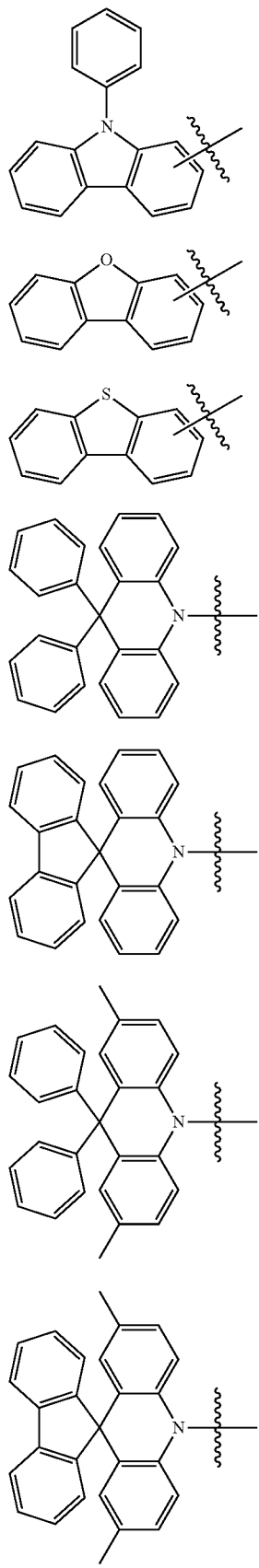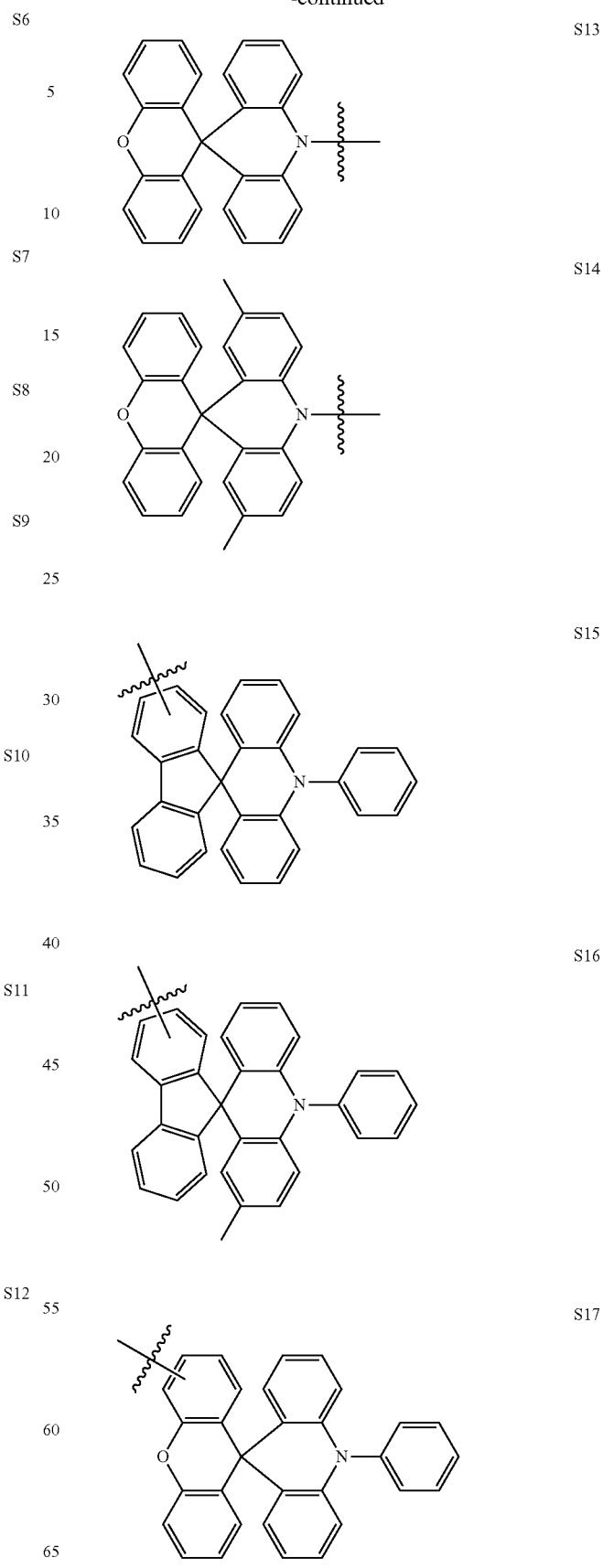

-continued

S18

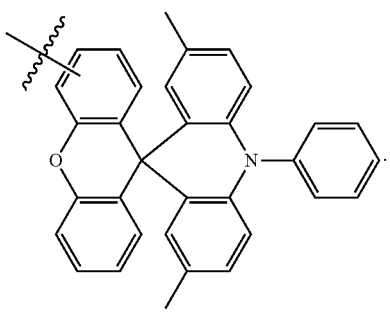

8. The organic electroluminescence device of claim 1, wherein Formula 1 is represented by the following Formula 4 or 5:

[Formula 4]

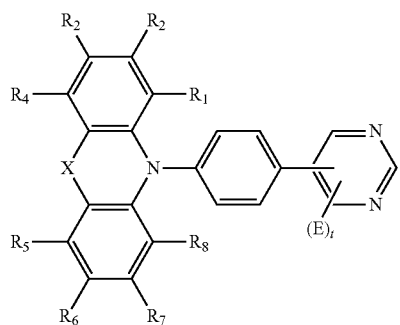

[Formula 5]

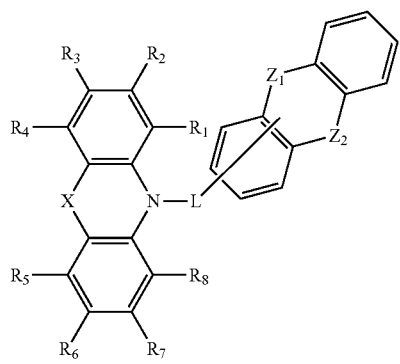

where E is a substituted or unsubstituted alkyl group having 1 to 20 carbon atoms, a substituted or unsubstituted aryl group having 6 to 30 carbon atoms for forming a ring, or a substituted or unsubstituted heteroaryl group having 4 to 30 carbon atoms for forming a ring, t is an integer of 0 to 3, $Z_1$ and $Z_2$ are each independently BR', NR", O, S, or C(=O), R' and R" are each independently a hydrogen atom, a substituted or unsubstituted alkyl group having 1 to 20 carbon atoms, a substituted or unsubstituted fluorenyl group, a substituted or unsubstituted aryl group having 6 to 30 carbon atoms for forming a ring, or a substituted or unsubstituted heteroaryl group having 4 to 30 carbon atoms for forming a ring, and X, L, and $R_1$ to $R_8$ are the same as defined in Formula 1.

9. An organic electroluminescence device, comprising:
a first electrode;
a hole transport region disposed on the first electrode;
an emission layer disposed on the hole transport region;
an electron transport region disposed on the emission layer; and
a second electrode disposed on the electron transport region,
wherein the first electrode and the second electrode each independently comprise at least one selected from Ag, Mg, Cu, Al, Pt, Pd, Au, Ni, Nd, Ir, Cr, Li, Ca, Li/F/Ca, LiF/Al, Mo, Ti, In, Sn, and Zn, or an oxide thereof, or a compound thereof, or a mixture thereof, and
the emission layer comprises at least one aromatic compound selected from Compound Group 1:

[Compound Group 1]

1

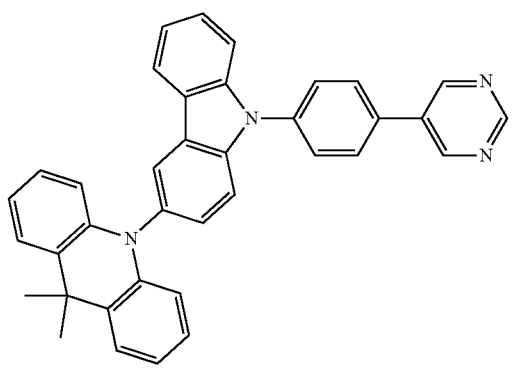

2

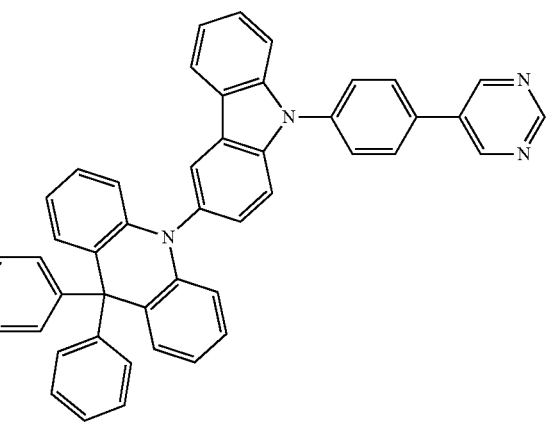

3

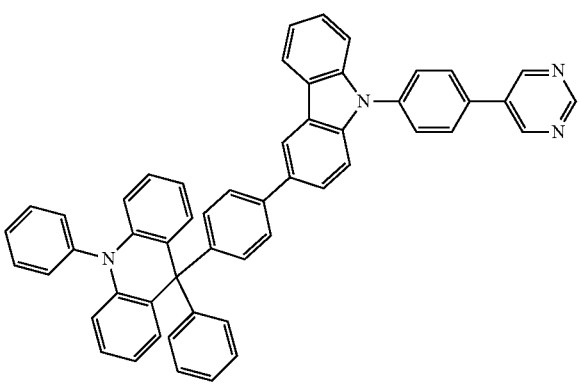

4
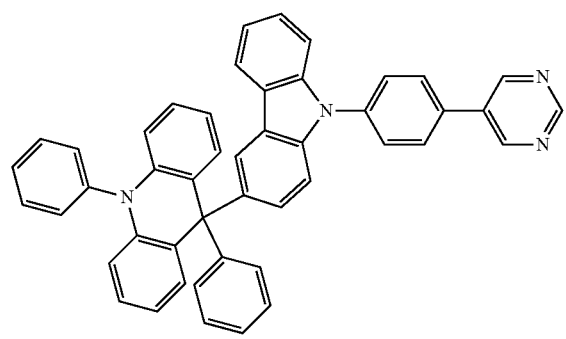
5
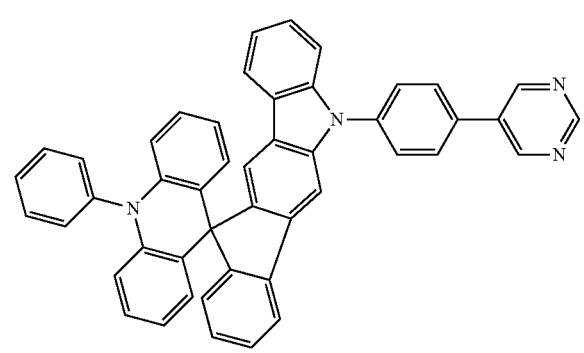
6
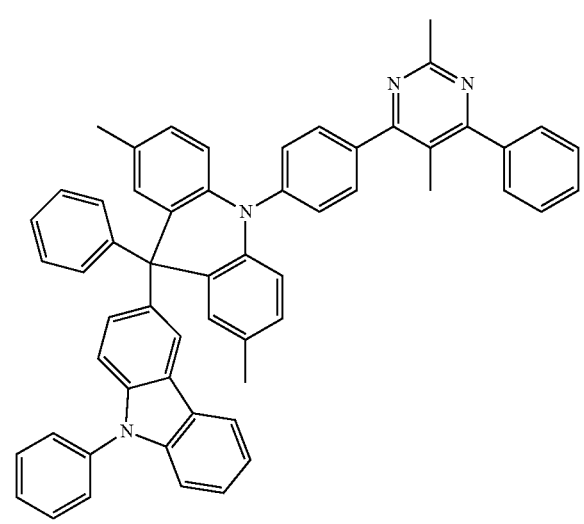
7
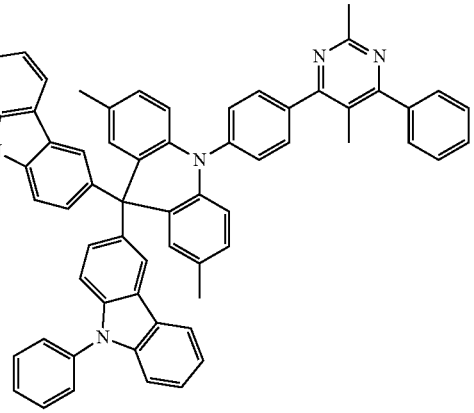
8
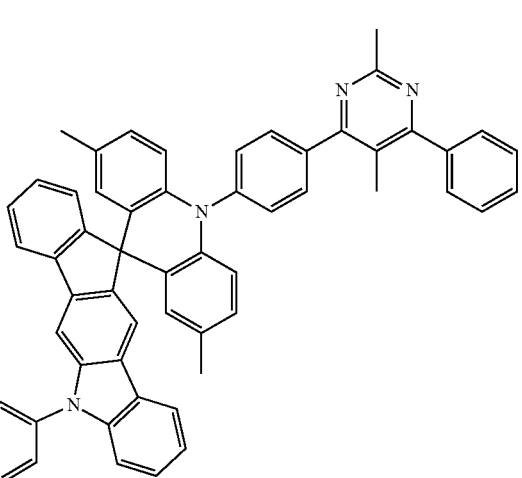
9
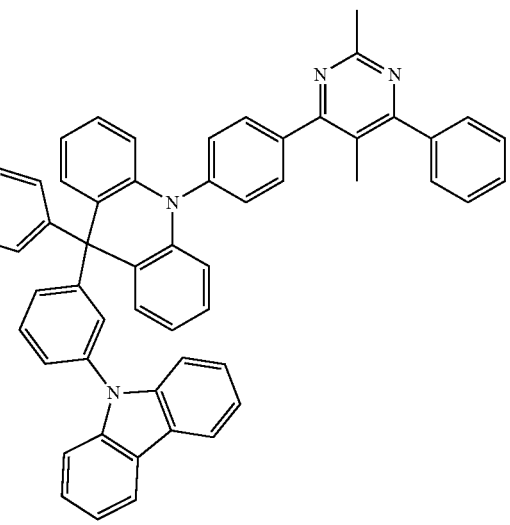

10
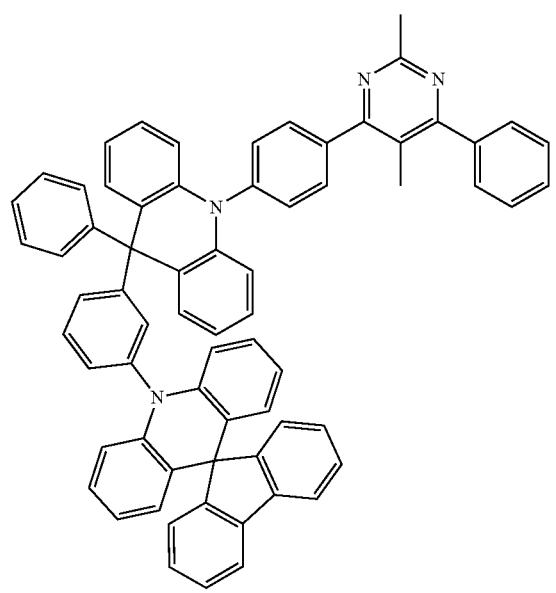
11
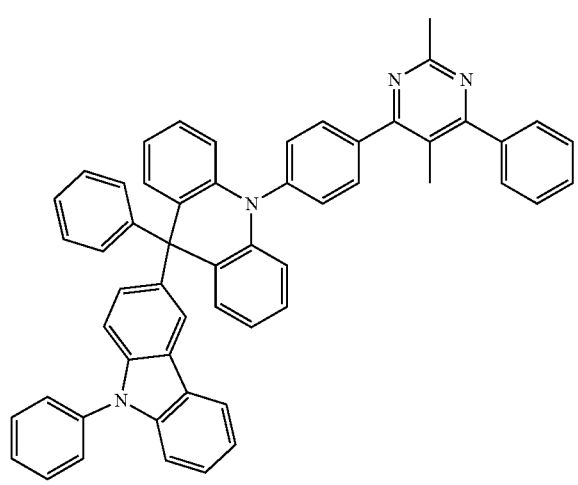
12
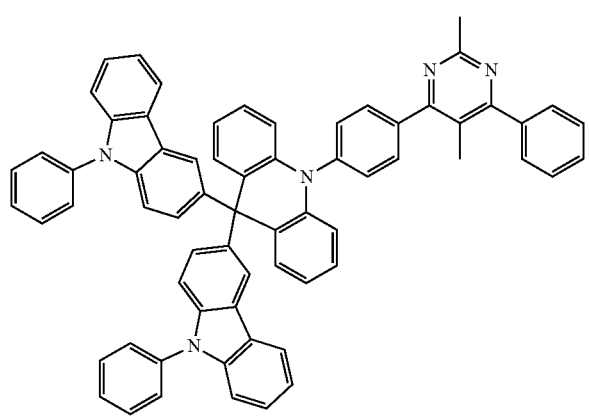
13
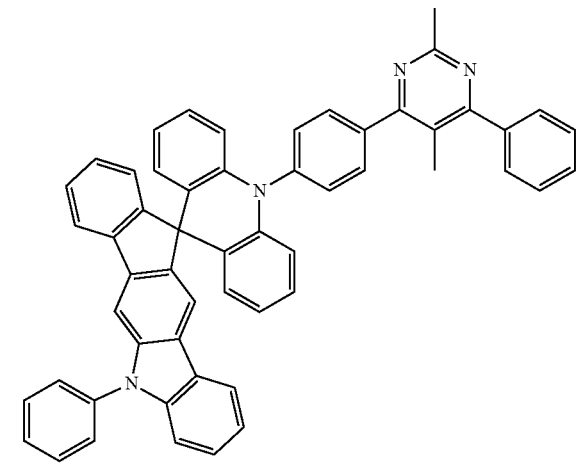
14
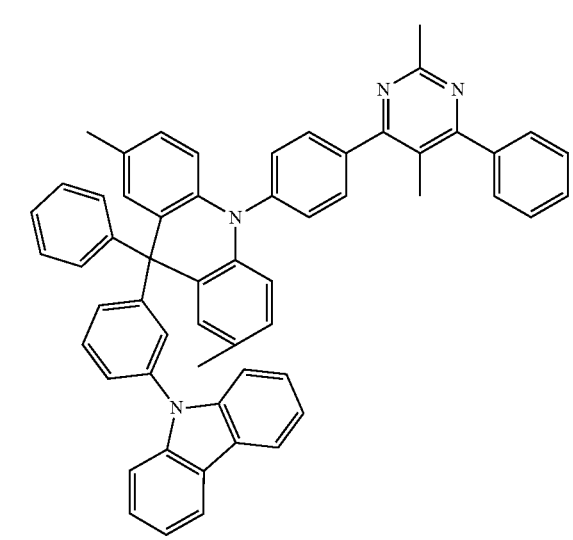
15
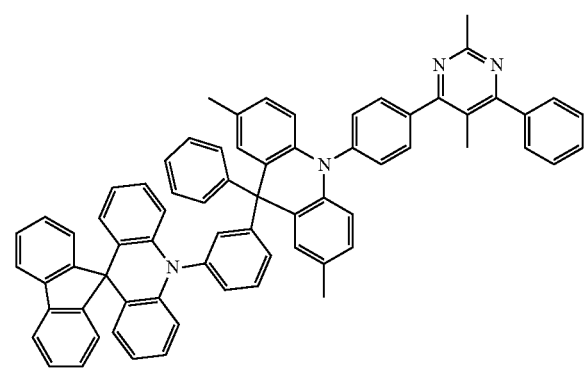

16
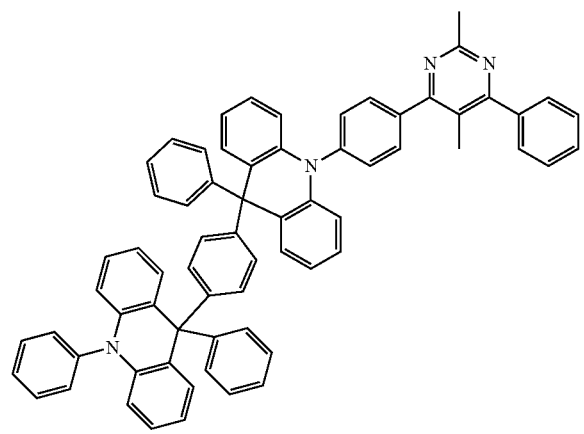
17
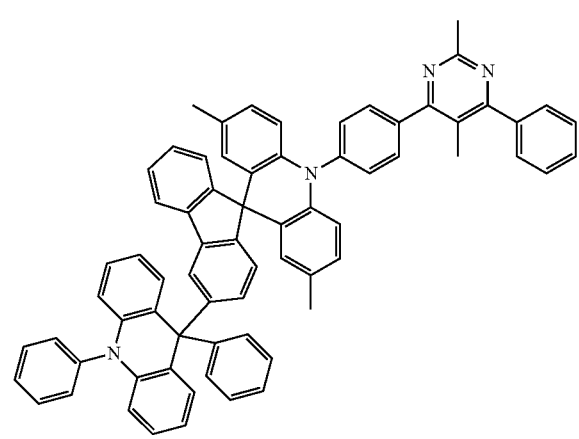
18
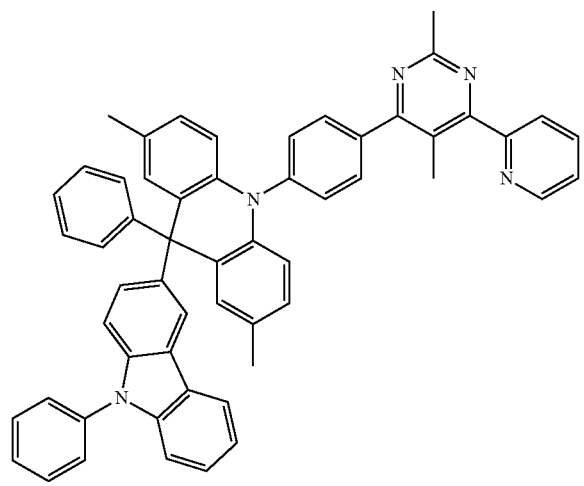
19
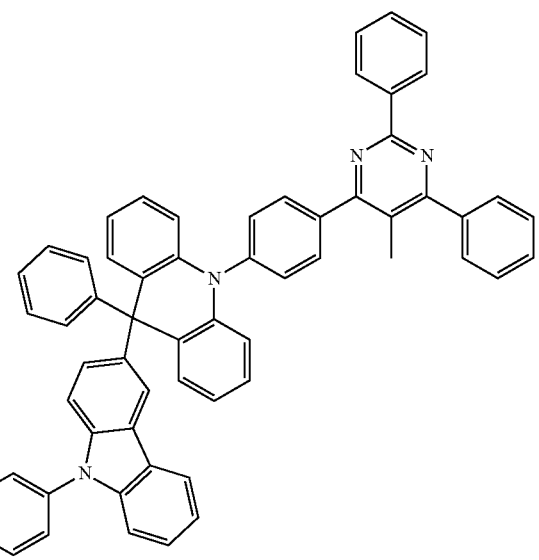
20
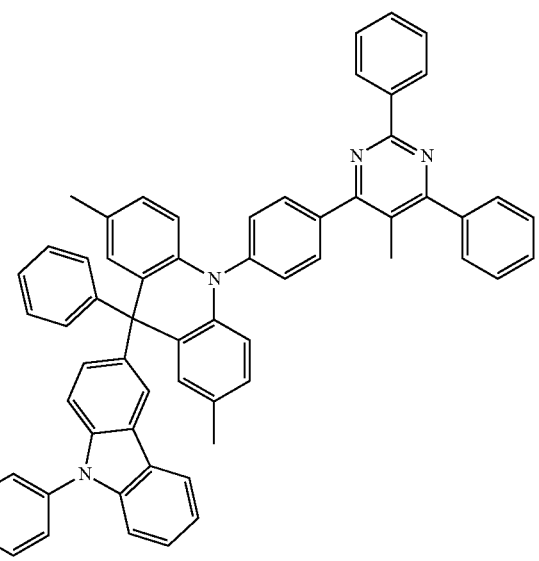
21
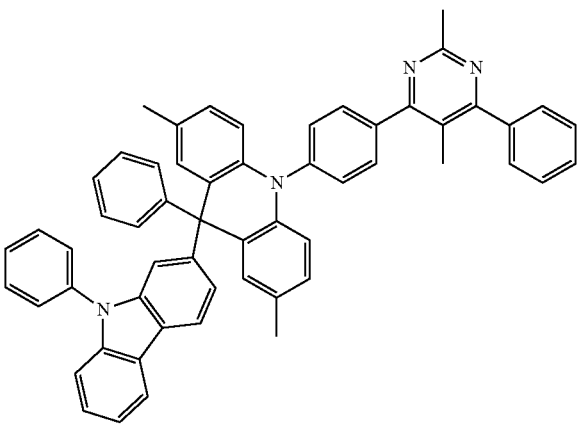

-continued
22
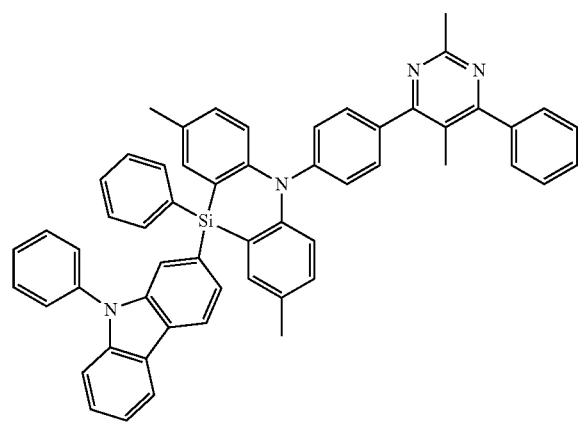
23
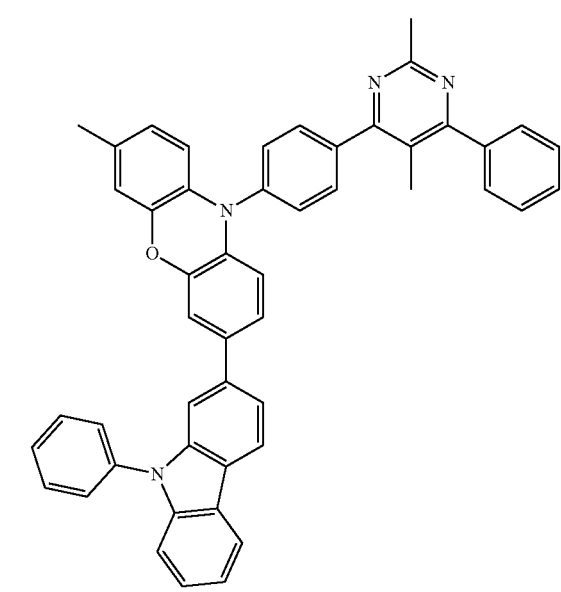
24
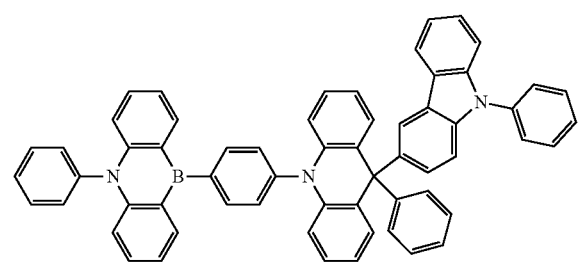
-continued
25
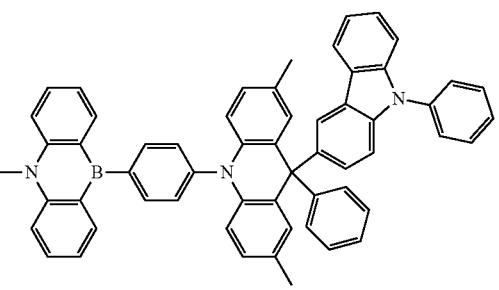
26
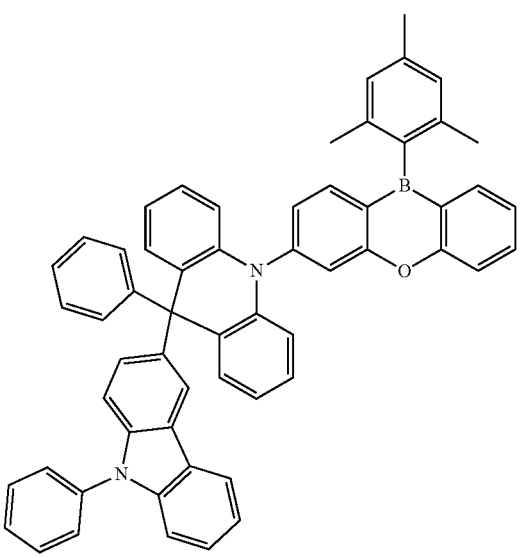
27
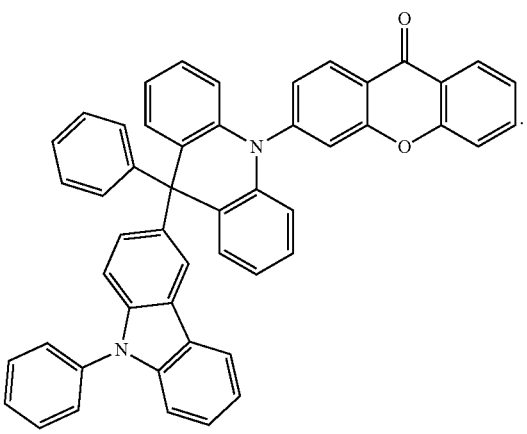
* * * * *